United States Patent
Zhu et al.

(10) Patent No.: US 8,334,456 B2
(45) Date of Patent: Dec. 18, 2012

(54) CONJUGATED POLYMERS AND THEIR USE IN OPTOELECTRONIC DEVICES

(75) Inventors: Zhengguo Zhu, Chelmsford, MA (US); Martin Drees, Glenview, IL (US); Hualong Pan, Skokie, IL (US); Yan Yao, Skokie, IL (US); He Yan, Skokie, IL (US); Shaofeng Lu, Skokie, IL (US); Antonio Facchetti, Chicago, IL (US)

(73) Assignee: Polyera Corporation, Skokie, IL (US)

( * ) Notice: Subject to any disclaimer, the term of this patent is extended or adjusted under 35 U.S.C. 154(b) by 271 days.

(21) Appl. No.: 12/785,357

(22) Filed: May 21, 2010

(65) Prior Publication Data

US 2010/0307594 A1 Dec. 9, 2010

Related U.S. Application Data

(60) Provisional application No. 61/323,152, filed on Apr. 12, 2010, provisional application No. 61/180,256, filed on May 21, 2009.

(51) Int. Cl.
*H01L 31/00* (2006.01)
*H01L 29/08* (2006.01)
*H01L 35/24* (2006.01)
*H01L 51/00* (2006.01)

(52) U.S. Cl. ............. 136/263; 257/40; 257/E51.026; 257/E51.027

(58) Field of Classification Search .............. 136/263
See application file for complete search history.

(56) References Cited

U.S. PATENT DOCUMENTS

2008/0103286 A1* 5/2008 Ong et al. ............... 528/373
2009/0181509 A1 7/2009 Pan et al.
2010/0078074 A1 4/2010 Yang et al.

FOREIGN PATENT DOCUMENTS

EP 1916250 4/2008

OTHER PUBLICATIONS

Hou et al., "Bandgap and Molecular Energy Level Control of Conjugated Polymer Photovoltaic Materials Based on Benzo[1,2-b:4,5-b']dithiophene," *Macromolecules*, 41:6012-6018 (2008).
Hou et al., "Synthesis and Photovoltaic Properties of Two Benzo[1,2-b:3,4-b']dithiophene-Based Conjugated Polymers," *J. Phys. Chem. C.*, 113:21202-21207 (2009).
Huo et al., "A Polybenzo[1,2-b:4,5-b']dithiophene Derivative with Deep HOMO Level and Its Application in High-Performance Polymer Solar Cells," *Angew. Chem. Int. Ed.*, 49:1500-1503 (2010).

* cited by examiner

*Primary Examiner* — Peter F Godenschwager
*Assistant Examiner* — David Karst
(74) *Attorney, Agent, or Firm* — Karen K. Chan

(57) ABSTRACT

Disclosed are certain polymeric compounds and their use as organic semiconductors in organic and hybrid optical, optoelectronic, and/or electronic devices such as photovoltaic cells, light emitting diodes, light emitting transistors, and field effect transistors. The disclosed compounds can provide improved device performance, for example, as measured by power conversion efficiency, fill factor, open circuit voltage, field-effect mobility, on/off current ratios, and/or air stability when used in photovoltaic cells or transistors. The disclosed compounds can have good solubility in common solvents enabling device fabrication via solution processes.

30 Claims, 3 Drawing Sheets

CONJUGATED POLYMERS AND THEIR USE IN OPTOELECTRONIC DEVICES

CROSS REFERENCE TO RELATED APPLICATIONS

This application claims priority to and the benefit of U.S. Provisional Patent Application Ser. No. 61/180,256, filed on May 21, 2009, and U.S. Provisional Patent Application Ser. No. 61/323,152, filed on Apr. 12, 2010, the disclosure of each of which is incorporated by reference herein in its entirety.

BACKGROUND

A new generation of optoelectronic devices such as organic photovoltaics (OPVs) and organic light-emitting transistors (OLETs) are fabricated using organic semiconductors as their active components. To be commercially relevant, these organic semiconductor-based devices should be processable in a cost-effective manner.

Bulk heterojunction (BHJ) solar cells commonly are considered the most promising OPV structures because they can be fabricated using roll-to-roll and large-scale production. BHJ solar cells include a photoactive layer disposed between an anode and a cathode, where the photoactive layer is composed of a blend film including a "donor" material and an "acceptor" material. FIG. 1 illustrates a representative BHJ organic solar cell structure.

State-of-the-art BHJ solar cells use fullerene-based compounds as the acceptor material. Typical fullerenes include C60 or C70 "bucky ball" compounds functionalized with solubilizing side chains, such as C60 [6,6]-phenyl-C61-butyric acid methyl ester ($C_{60}$PCBM) or $C_{70}$PCBM. The most common donor material used in BHJ solar cells is poly(3-hexylthiophene) (P3HT).

Important performance parameters for BHJ solar cells include power conversion efficiency (PCE), open circuit voltage ($V_{oc}$), fill factor (FF), and short circuit current ($J_{sc}$). PCE ($\eta$) can be determined by the equation:

$$\eta = P_m/(E^*A_c)$$

where $P_m$ represents the maximum power point of the solar cell, E represents the input light irradiance (measured in W/m$^2$) under standard test conditions, and $A_c$ represents the surface area of the solar cell (measured in m$^2$). Because FF is defined as the ratio of the actual maximum obtainable power, ($P_m$) to the theoretical (not actually obtainable) power, ($J_{sc}*V_{oc}$), or simply FF=$P_m/(J_{sc}*V_{oc})$, it can be seen that PCE ($\eta$) is directly correlated to each of $V_{oc}$, FF, and $J_{sc}$:

$$\eta = P_m/(E^*A_c) = FF^*(J_{sc}^*V_{oc})/(E^*A_c)$$

In addition, one of the fundamental limitations of solar cell efficiency is the band-gap of the donor material from which the solar cell is made. A common approach to estimate the band-gap of a π-conjugated material is to measure the optical absorption and calculate the energy at the longest wavelength onset. It is generally believed that, in order for BHJ solar cells to be commercially viable, they must achieve high $V_{oc}$ (>~0.7 V), high FF (>~65%), and an optimized $J_{sc}$. It has been shown that $J_{sc}$ is optimally satisfied by absorbers having a band gap<~1.6 eV.

It is important to point out that the $V_{oc}$ of a BHJ solar cell can be determined empirically by the equation:

$$V_{oc} = -(E_{HOMO}(\text{donor}) - E_{LUMO}(\text{acceptor}) + 0.4)/e$$

where $E_{HOMO}$, $E_{LUMO}$, and e are the Highest Occupied Molecular Orbital (HOMO) energy (or HOMO level), the Lowest Unoccupied Molecular Orbital (LUMO) energy (or LUMO level), and the electron charge, respectively. For example, the LUMO level of PCBM is about −4.3 eV. The $V_{oc}$ of a solar cell, therefore, also can be used to estimate the HOMO level of the donor material (given the known LUMO level of PCBM). The HOMO level of the donor material often determines its air stability. For example, state-of-the-art P3HT/PCBM BHJ solar cells typically have a $V_{oc}$ of about 0.6 V, suggesting that the HOMO level of P3HT is ~−5.3 eV. However, it is well known that P3HT has poor air stability. It is generally believed that a donor material having a lower HOMO value than P3HT (i.e., ~−5.4 eV or lower) will have improved oxidative stability over P3HT. In addition, as explained above, a donor material with a lower HOMO level also will likely increase the $V_{oc}$ of a solar cell, and in turn, its efficiency.

State-of-the-art BHJ solar cells (e.g., P3HT/PCBM-based solar cells) exhibit a PCE of ~4-5%. However, they have several fundamental limitations. First, the band-gap of P3HT is ~2.0 eV, and it can absorb only a small portion (30%) of the solar spectrum. It is important to develop a donor material with a band-gap of about 1.6 eV or smaller so that a larger portion of the solar spectrum can be utilized. In other words, the donor material needs to have an absorption onset at ~800 nm or larger (the absorption onset of a material is equal to 1240 nm divided by its band-gap) to match the peak intensity region (700-800 nm) of the solar spectrum.

Accordingly, much effort has been made to develop low band-gap (<~1.6 eV) donor materials to replace P3HT in BHJ solar cells. Although there have been a few reports of low band-gap donor-based BHJ solar cells, none of these solar cells showed much performance improvement over P3HT/PCBM-based solar cells. One problem appears to be that solar cells based on these new low band-gap donor materials still exhibit a low $V_{oc}$ of ~0.6 V, indicating that the low band-gap donor materials have a HOMO level of ~5.3 eV and thus, similar stability problems as P3HT. Also important, the BHJ solar cells based on these new donor materials typically exhibit poor fill factor (<60%).

SUMMARY

In light of the foregoing, the present teachings provide certain oligomeric and polymeric compounds that can be used as organic semiconductors. Also provided are associated devices and related methods for the preparation and use of these compounds. The present compounds can exhibit properties such as excellent charge transport characteristics in ambient conditions, optimized optical absorption, chemical stability, low-temperature processability, large solubility in common solvents, and processing versatility (e.g., via various solution processes). As a result, optoelectronic devices such as solar cells that incorporate one or more of the present compounds as a photoactive layer can exhibit high performance in ambient conditions, for example, demonstrating one or more of low band-gap, high fill factor, high open circuit voltage, and high power conversion efficiency, and preferably all of these criteria. Similarly, other organic semiconductor-based devices such as OLETs can be fabricated efficiently using the organic semiconductor materials described herein.

The present teachings also provide methods of preparing such compounds and semiconductor materials, as well as various compositions, composites, and devices that incorporate the compounds and semiconductor materials disclosed herein.

The foregoing as well as other features and advantages of the present teachings will be more fully understood from the following figures, description, examples, and claims.

BRIEF DESCRIPTION OF DRAWINGS

It should be understood that the drawings described below are for illustration purpose only. The drawings are not necessarily to scale, with emphasis generally being placed upon illustrating the principles of the present teachings. The drawings are not intended to limit the scope of the present teachings in any way.

DETAILED DESCRIPTION

Figure 1:
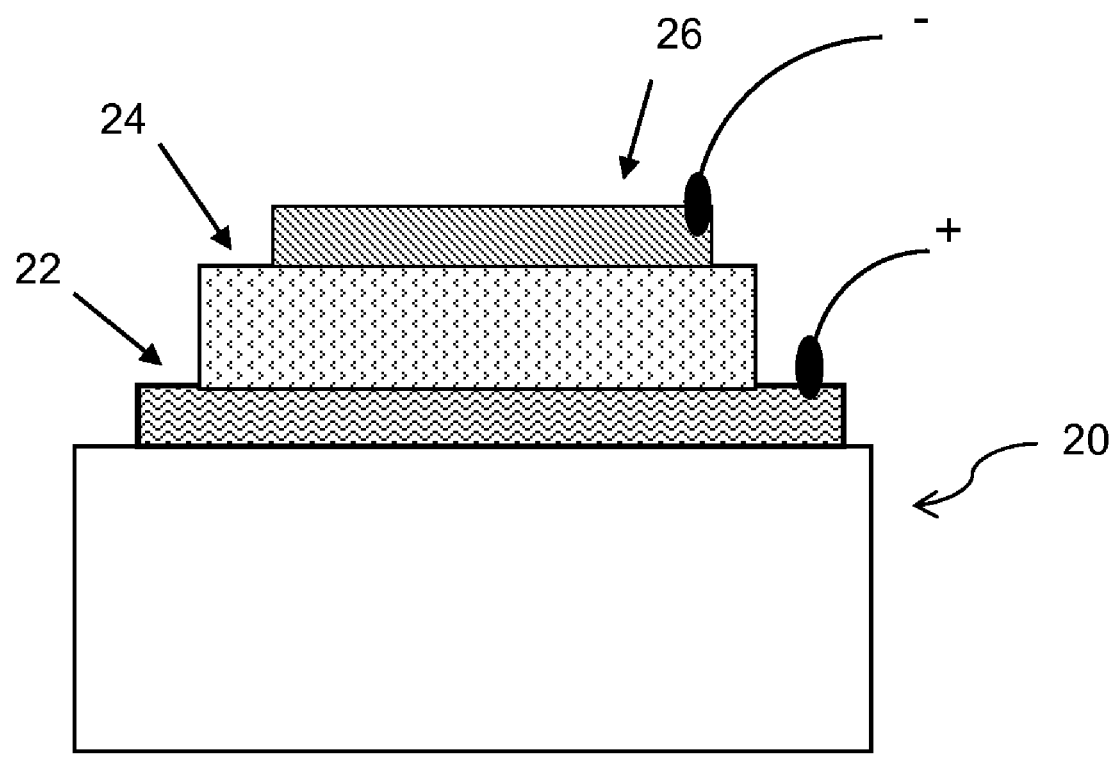
FIG. 1 illustrates a representative bulk-heterojunction (BHJ) organic photovoltaic device (also known as a solar cell) structure, which can incorporate one or more compounds of the present teachings as its photoactive layer (as donor and/or acceptor materials).

The present teachings provide organic semiconductor materials that are prepared from various π-conjugated oligomeric and polymeric compounds having typically an electron-rich repeat unit and an electron-poor repeat unit. Compounds of the present teachings can exhibit semiconductor behavior such as high carrier mobility and/or good current modulation characteristics in a field-effect device, optimized light absorption/charge separation in a photovoltaic device, and/or charge transport/recombination/light emission in a light-emitting device. In addition, the present compounds can possess certain processing advantages such as solution-processability and/or good stability (e.g., air stability) in ambient conditions. The compounds of the present teachings can be used to prepare either p-type (donor or hole-transporting), n-type (acceptor or electron-transporting), or ambipolar semiconductor materials, which in turn can be used to fabricate various organic or hybrid optoelectronic articles, structures and devices, including organic photovoltaic devices and organic light-emitting transistors.

Throughout the application, where compositions are described as having, including, or comprising specific components, or where processes are described as having, including, or comprising specific process steps, it is contemplated that compositions of the present teachings also consist essentially of, or consist of, the recited components, and that the processes of the present teachings also consist essentially of, or consist of, the recited process steps.

In the application, where an element or component is said to be included in and/or selected from a list of recited elements or components, it should be understood that the element or component can be any one of the recited elements or components, or the element or component can be selected from a group consisting of two or more of the recited elements or components. Further, it should be understood that elements and/or features of a composition, an apparatus, or a method described herein can be combined in a variety of ways without departing from the spirit and scope of the present teachings, whether explicit or implicit herein.

The use of the terms "include," "includes", "including," "have," "has," or "having" should be generally understood as open-ended and non-limiting unless specifically stated otherwise.

The use of the singular herein includes the plural (and vice versa) unless specifically stated otherwise. In addition, where the use of the term "about" is before a quantitative value, the present teachings also include the specific quantitative value itself, unless specifically stated otherwise. As used herein, the term "about" refers to a ±10% variation from the nominal value unless otherwise indicated or inferred.

It should be understood that the order of steps or order for performing certain actions is immaterial so long as the present teachings remain operable. Moreover, two or more steps or actions may be conducted simultaneously.

As used herein, an "oligomeric compound" (or "oligomer") or a "polymeric compound" (or "polymer") refers to a molecule including a plurality of one or more repeat units connected by covalent chemical bonds. An oligomeric or polymeric compound can be represented by the general formula:

$$*\!-\!(\mathrm{M})\!-\!*$$

wherein M is the repeat unit or monomer. The degree of polymerization can range from 2 to greater than 10,000. For example, for oligomeric compounds, the degree of polymerization can range from 2 to 9; and for polymeric compounds, the degree of polymerization can range from 10 to about 10,000. The oligomeric or polymeric compound can have only one type of repeat unit as well as two or more types of different repeat units. When a polymeric compound has only one type of repeat unit, it can be referred to as a homopolymer. When a polymeric compound has two or more types of different repeat units, the term "copolymer" or "copolymeric compound" can be used instead. The oligomeric or polymeric compound can be linear or branched. Branched polymers can include dendritic polymers, such as dendronized polymers, hyperbranched polymers, brush polymers (also called bottlebrushes), and the like. Unless specified otherwise, the assembly of the repeat units in the copolymer can be head-to-tail, head-to-head, or tail-to-tail. In addition, unless specified otherwise, the copolymer can be a random copolymer, an alternating copolymer, or a block copolymer. For example, the general formula:

$$*\!-\!(\mathrm{A}_x\!-\!\mathrm{B}_y)_{\overline{n}}\!-\!*$$

can be used to represent a co-oligomer or copolymer of A and B having x mole fraction of A and y mole fraction of B in the copolymer, where the manner in which comonomers A and B is repeated can be alternating, random, regiorandom, regioregular, or in blocks. The degree of polymerization (n) can range from 2 to greater than 10,000.

As used herein, a "cyclic moiety" can include one or more (e.g., 1-6) carbocyclic or heterocyclic rings. The cyclic moiety can be a cycloalkyl group, a heterocycloalkyl group, an aryl group, or a heteroaryl group (i.e., can include only saturated bonds, or can include one or more unsaturated bonds regardless of aromaticity), each including, for example, 3-24 ring atoms and optionally can be substituted as described herein. In embodiments where the cyclic moiety is a "monocyclic moiety," the "monocyclic moiety" can include a 3-14 membered aromatic or non-aromatic, carbocyclic or heterocyclic ring. A monocyclic moiety can include, for example, a phenyl group or a 5- or 6-membered heteroaryl group, each of which optionally can be substituted as described herein. In embodiments where the cyclic moiety is a "polycyclic moiety," the "polycyclic moiety" can include two or more rings fused to each other (i.e., sharing a common bond) and/or connected to each other via a spiro atom, or one or more bridged atoms. A polycyclic moiety can include an 8-24 membered aromatic or non-aromatic, carbocyclic or heterocyclic ring, such as a $C_{8-24}$ aryl group or an 8-24 membered heteroaryl group, each of which optionally can be substituted as described herein.

As used herein, "halo" or "halogen" refers to fluoro, chloro, bromo, and iodo.

As used herein, "oxo" refers to a double-bonded oxygen (i.e., =O).

As used herein, "alkyl" refers to a straight-chain or branched saturated hydrocarbon group. Examples of alkyl groups include methyl (Me), ethyl (Et), propyl (e.g., n-propyl and iso-propyl), butyl (e.g., n-butyl, iso-butyl, sec-butyl, tert-butyl), pentyl groups (e.g., n-pentyl, iso-pentyl, neo-pentyl), hexyl groups, and the like. In various embodiments, an alkyl group can have 1 to 40 carbon atoms (i.e., $C_{1-40}$ alkyl group), for example, 1-20 carbon atoms (i.e., $C_{1-20}$ alkyl group). In some embodiments, an alkyl group can have 1 to 6 carbon atoms, and can be referred to as a "lower alkyl group." Examples of lower alkyl groups include methyl, ethyl, propyl (e.g., n-propyl and iso-propyl), and butyl groups (e.g., n-butyl, iso-butyl, sec-butyl, tert-butyl). In some embodiments, alkyl groups can be substituted as described herein. An alkyl group is generally not substituted with another alkyl group, an alkenyl group, or an alkynyl group.

As used herein, "haloalkyl" refers to an alkyl group having one or more halogen substituents. At various embodiments, a haloalkyl group can have 1 to 40 carbon atoms (i.e., $C_{1-40}$ haloalkyl group), for example, 1 to 20 carbon atoms (i.e., $C_{1-20}$ haloalkyl group). Examples of haloalkyl groups include $CF_3$, $C_2F_5$, $CHF_2$, $CH_2F$, $CCl_3$, $CHCl_2$, $CH_2Cl$, $C_2Cl_5$, and the like. Perhaloalkyl groups, i.e., alkyl groups where all of the hydrogen atoms are replaced with halogen atoms (e.g., $CF_3$ and $C_2F_5$), are included within the definition of "haloalkyl." For example, a $C_{1-40}$ haloalkyl group can have the formula $—C_sH_{2s+1-t}X^0_t$, where $X^0$, at each occurrence, is F, Cl, Br or I, s is an integer in the range of 1 to 40, and t is an integer in the range of 1 to 81, provided that t is less than or equal to 2s+1. Haloalkyl groups that are not perhaloalkyl groups can be substituted as described herein.

As used herein, "alkoxy" refers to —O-alkyl group. Examples of alkoxy groups include, but are not limited to, methoxy, ethoxy, propoxy (e.g., n-propoxy and isopropoxy), t-butoxy, pentoxyl, hexoxyl groups, and the like. The alkyl group in the —O-alkyl group can be substituted as described herein.

As used herein, "alkylthio" refers to an —S-alkyl group (which, in some cases, can be expressed as $—S(O)_w$-alkyl, wherein w is 0). Examples of alkylthio groups include, but are not limited to, methylthio, ethylthio, propylthio (e.g., n-propylthio and isopropylthio), t-butylthio, pentylthio, hexylthio groups, and the like. The alkyl group in the —S-alkyl group can be substituted as described herein.

As used herein, "arylalkyl" refers to an -alkyl-aryl group, where the arylalkyl group is covalently linked to the defined chemical structure via the alkyl group. An arylalkyl group is within the definition of a —Y—$C_{6-14}$ aryl group, where Y is as defined herein. An example of an arylalkyl group is a benzyl group (—$CH_2$—$C_6H_5$). An arylalkyl group optionally can be substituted, i.e., the aryl group and/or the alkyl group, can be substituted as disclosed herein.

As used herein, "alkenyl" refers to a straight-chain or branched alkyl group having one or more carbon-carbon double bonds. Examples of alkenyl groups include ethenyl, propenyl, butenyl, pentenyl, hexenyl, butadienyl, pentadienyl, hexadienyl groups, and the like. The one or more carbon-carbon double bonds can be internal (such as in 2-butene) or terminal (such as in 1-butene). In various embodiments, an alkenyl group can have 2 to 40 carbon atoms (i.e., $C_{2-40}$ alkenyl group), for example, 2 to 20 carbon atoms (i.e., $C_{2-20}$ alkenyl group). In some embodiments, alkenyl groups can be substituted as described herein. An alkenyl group is generally not substituted with another alkenyl group, an alkyl group, or an alkynyl group.

As used herein, "alkynyl" refers to a straight-chain or branched alkyl group having one or more triple carbon-carbon bonds. Examples of alkynyl groups include ethynyl, propynyl, butynyl, pentynyl, hexynyl, and the like. The one or more triple carbon-carbon bonds can be internal (such as in 2-butyne) or terminal (such as in 1-butyne). In various embodiments, an alkynyl group can have 2 to 40 carbon atoms (i.e., $C_{2-40}$ alkynyl group), for example, 2 to 20 carbon atoms (i.e., $C_{2-20}$ alkynyl group). In some embodiments, alkynyl groups can be substituted as described herein. An alkynyl group is generally not substituted with another alkynyl group, an alkyl group, or an alkenyl group.

As used herein, "cycloalkyl" refers to a non-aromatic carbocyclic group including cyclized alkyl, alkenyl, and alkynyl groups. In various embodiments, a cycloalkyl group can have 3 to 24 carbon atoms, for example, 3 to 20 carbon atoms (e.g., $C_{3-14}$ cycloalkyl group). A cycloalkyl group can be monocyclic (e.g., cyclohexyl) or polycyclic (e.g., containing fused, bridged, and/or spiro ring systems), where the carbon atoms are located inside or outside of the ring system. Any suitable ring position of the cycloalkyl group can be covalently linked to the defined chemical structure. Examples of cycloalkyl groups include cyclopropyl, cyclobutyl, cyclopentyl, cyclohexyl, cycloheptyl, cyclopentenyl, cyclohexenyl, cyclohexadienyl, cycloheptatrienyl, norbornyl, norpinyl, norcaryl, adamantyl, and spiro[4.5]decanyl groups, as well as their homologs, isomers, and the like. In some embodiments, cycloalkyl groups can be substituted as described herein.

As used herein, "heteroatom" refers to an atom of any element other than carbon or hydrogen and includes, for example, nitrogen, oxygen, silicon, sulfur, phosphorus, and selenium.

As used herein, "cycloheteroalkyl" refers to a non-aromatic cycloalkyl group that contains at least one ring heteroatom selected from O, S, Se, N, P, and Si (e.g., O, S, and N), and optionally contains one or more double or triple bonds. A cycloheteroalkyl group can have 3 to 24 ring atoms, for example, 3 to 20 ring atoms (e.g., 3-14 membered cycloheteroalkyl group). One or more N, P, S, or Se atoms (e.g., N or S) in a cycloheteroalkyl ring may be oxidized (e.g., morpholine N-oxide, thiomorpholine S-oxide, thiomorpholine S,S-dioxide). In some embodiments, nitrogen or phosphorus atoms of cycloheteroalkyl groups can bear a substituent, for example, a hydrogen atom, an alkyl group, or other substituents as described herein. Cycloheteroalkyl groups can also contain one or more oxo groups, such as oxopiperidyl, oxooxazolidyl, dioxo-(1H,3H)-pyrimidyl, oxo-2(1H)-pyridyl, and the like. Examples of cycloheteroalkyl groups include, among others, morpholinyl, thiomorpholinyl, pyranyl, imidazolidinyl, imidazolinyl, oxazolidinyl, pyrazolidinyl, pyrazolinyl, pyrrolidinyl, pyrrolinyl, tetrahydrofuranyl, tetrahydrothiophenyl, piperidinyl, piperazinyl, and the like. In some embodiments, cycloheteroalkyl groups can be substituted as described herein.

As used herein, "aryl" refers to an aromatic monocyclic hydrocarbon ring system or a polycyclic ring system in which two or more aromatic hydrocarbon rings are fused (i.e., having a bond in common with) together or at least one aromatic monocyclic hydrocarbon ring is fused to one or more cycloalkyl and/or cycloheteroalkyl rings. An aryl group can have 6 to 24 carbon atoms in its ring system (e.g., $C_{6-20}$ aryl group), which can include multiple fused rings. In some embodiments, a polycyclic aryl group can have 8 to 24 carbon atoms. Any suitable ring position of the aryl group can be covalently linked to the defined chemical structure. Examples of aryl groups having only aromatic carbocyclic ring(s) include phenyl, 1-naphthyl (bicyclic), 2-naphthyl (bicyclic), anthracenyl (tricyclic), phenanthrenyl (tricyclic), pentacenyl (pentacyclic), and like groups. Examples of polycyclic ring systems in which at least one aromatic carbocyclic ring is fused to one or more cycloalkyl and/or cycloheteroalkyl rings include, among others, benzo derivatives of cyclopentane (i.e., an indanyl group, which is a 5,6-bicyclic cycloalkyl/aromatic ring system), cyclohexane (i.e., a tetrahydronaphthyl group, which is a 6,6-bicyclic cycloalkyl/aromatic ring system), imidazoline (i.e., a benzimidazolinyl group, which is a 5,6-bicyclic cycloheteroalkyl/aromatic ring system), and pyran (i.e., a chromenyl group, which is a 6,6-bicyclic cycloheteroalkyl/aromatic ring system). Other examples of aryl groups include benzodioxanyl, benzodioxolyl, chromanyl, indolinyl groups, and the like. In some embodiments, aryl groups can be substituted as described herein. In some embodiments, an aryl group can have one or more halogen substituents, and can be referred to as a "haloaryl" group. Perhaloaryl groups, i.e., aryl groups where all of the hydrogen atoms are replaced with halogen atoms (e.g., —$C_6F_5$), are included within the definition of "haloaryl." In certain embodiments, an aryl group is substituted with another aryl group and can be referred to as a biaryl group. Each of the aryl groups in the biaryl group can be substituted as disclosed herein.

As used herein, "heteroaryl" refers to an aromatic monocyclic ring system containing at least one ring heteroatom selected from oxygen (O), nitrogen (N), sulfur (S), silicon (Si), and selenium (Se) or a polycyclic ring system where at least one of the rings present in the ring system is aromatic and contains at least one ring heteroatom. Polycyclic heteroaryl groups include those having two or more heteroaryl rings fused together, as well as those having at least one monocyclic heteroaryl ring fused to one or more aromatic carbocyclic rings, non-aromatic carbocyclic rings, and/or non-aromatic cycloheteroalkyl rings. A heteroaryl group, as a whole, can have, for example, 5 to 24 ring atoms and contain 1-5 ring heteroatoms (i.e., 5-20 membered heteroaryl group). The heteroaryl group can be attached to the defined chemical structure at any heteroatom or carbon atom that results in a stable structure. Generally, heteroaryl rings do not contain O—O, S—S, or S—O bonds. However, one or more N or S atoms in a heteroaryl group can be oxidized (e.g., pyridine N-oxide, thiophene S-oxide, thiophene S,S-dioxide). Examples of heteroaryl groups include, for example, the 5- or 6-membered monocyclic and 5-6 bicyclic ring systems shown below:

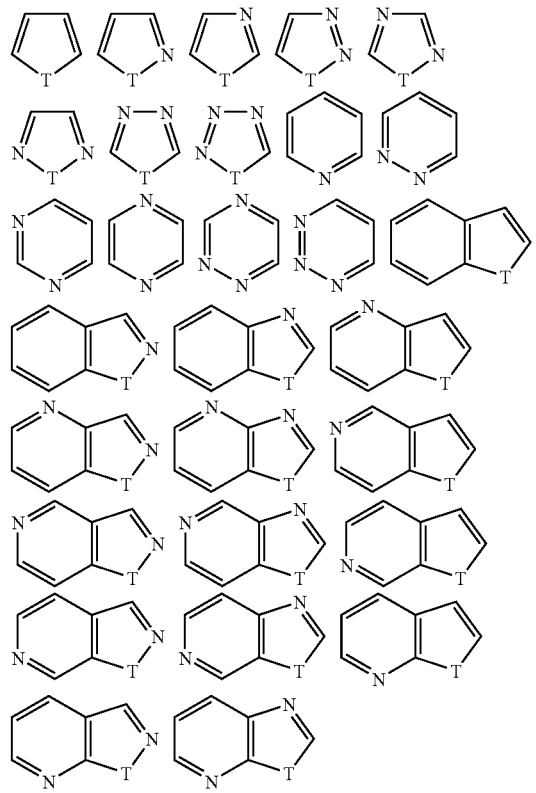

where T is O, S, NH, N-alkyl, N-aryl, N-(arylalkyl) (e.g., N-benzyl), $SiH_2$, SiH(alkyl), Si(alkyl)$_2$, SiH(arylalkyl), Si(arylalkyl)$_2$, or Si(alkyl)(arylalkyl). Examples of such heteroaryl rings include pyrrolyl, furyl, thienyl, pyridyl, pyrimidyl, pyridazinyl, pyrazinyl, triazolyl, tetrazolyl, pyrazolyl, imidazolyl, isothiazolyl, thiazolyl, thiadiazolyl, isoxazolyl, oxazolyl, oxadiazolyl, indolyl, isoindolyl, benzofuryl, benzothienyl, quinolyl, 2-methylquinolyl, isoquinolyl, quinoxalyl, quinazolyl, benzotriazolyl, benzimidazolyl, benzothiazolyl, benzisothiazolyl, benzisoxazolyl, benzoxadiazolyl, benzoxazolyl, cinnolinyl, 1H-indazolyl, 2H-indazolyl, indolizinyl, isobenzofuryl, naphthyridinyl, phthalazinyl, pteridinyl, purinyl, oxazolopyridinyl, thiazolopyridinyl, imidazopyridinyl, furopyridinyl, thienopyridinyl, pyridopyrimidinyl, pyridopyrazinyl, pyridopyridazinyl, thienothiazolyl, thienoxazolyl, thienoimidazolyl groups, and the like. Further examples of heteroaryl groups include 4,5,6,7-tetrahydroindolyl, tetrahydroquinolinyl, benzothienopyridinyl, benzofuropyridinyl groups, and the like. In some embodiments, heteroaryl groups can be substituted as described herein.

Compounds of the present teachings can include a "divalent group" defined herein as a linking group capable of forming a covalent bond with two other moieties. For example, compounds of the present teachings can include a divalent $C_{1-20}$ alkyl group (e.g., a methylene group), a divalent $C_{2-20}$ alkenyl group (e.g., a vinylyl group), a divalent $C_{2-20}$ alkynyl group (e.g., an ethynylyl group). a divalent $C_{6-14}$ aryl group (e.g., a phenylyl group); a divalent 3-14 membered cycloheteroalkyl group (e.g., a pyrrolidylyl), and/or a divalent 5-14 membered heteroaryl group (e.g., a thienylyl group). Generally, a chemical group (e.g., —Ar—) is understood to be divalent by the inclusion of the two bonds before and after the group.

The electron-donating or electron-withdrawing properties of several hundred of the most common substituents, reflecting all common classes of substituents have been determined, quantified, and published. The most common quantification of electron-donating and electron-withdrawing properties is in terms of Hammett σ values. Hydrogen has a Hammett σ value of zero, while other substituents have Hammett σ values that increase positively or negatively in direct relation to their electron-withdrawing or electron-donating characteristics. Substituents with negative Hammett σ values are considered electron-donating, while those with positive Hammett σ values are considered electron-withdrawing. See Lange's Handbook of Chemistry, 12th ed., McGraw Hill, 1979, Table 3-12, pp. 3-134 to 3-138, which lists Hammett σ values for a large number of commonly encountered substituents and is incorporated by reference herein.

It should be understood that the term "electron-accepting group" can be used synonymously herein with "electron acceptor" and "electron-withdrawing group". In particular, an "electron-withdrawing group" ("EWG") or an "electron-accepting group" or an "electron-acceptor" refers to a functional group that draws electrons to itself more than a hydrogen atom would if it occupied the same position in a molecule. Examples of electron-withdrawing groups include, but are not limited to, halogen or halo (e.g., F, Cl, Br, I), —$NO_2$, —CN, —NC, —$S(R^o)_2{}^+$, —$N(R^o)_3{}^+$, —$SO_3H$, —$SO_2R^o$, —$SO_3R^o$, —$SO_2NHR^o$, —$SO_2N(R^o)_2$, —COOH, —$COR^o$, —$COOR^o$, —$CONHR^o$, —$CON(R^o)_2$, $C_{1-40}$ haloalkyl groups, $C_{6-14}$ aryl groups, and 5-14 membered electron-poor heteroaryl groups; where $R^o$ is a $C_{1-20}$ alkyl group, a $C_{2-20}$ alkenyl group, a $C_{2-20}$ alkynyl group, a $C_{1-20}$ haloalkyl group, a $C_{1-20}$ alkoxy group, a $C_{6-14}$ aryl group, a $C_{3-14}$ cycloalkyl group, a 3-14 membered cycloheteroalkyl group, and a 5-14 membered heteroaryl group, each of which optionally can be substituted as described herein. For example, each of the $C_{1-20}$ alkyl group, the $C_{2-20}$ alkenyl group, the $C_{2-20}$ alkynyl group, the $C_{1-20}$ haloalkyl group, the $C_{1-20}$ alkoxy group, the $C_{6-14}$ aryl group, the $C_{3-14}$ cycloalkyl group, the 3-14 membered cycloheteroalkyl group, and the 5-14 membered heteroaryl group optionally can be substituted with 1-5 small electron-withdrawing groups such as F, Cl, Br, —$NO_2$, —CN, —NC, —$S(R^o)_2{}^+$, —$N(R^o)_3{}^+$, —$SO_3H$, —$SO_2R^o$, —$SO_3R^o$, —$SO_2NHR^o$, —$SO_2N(R^o)_2$, —COOH, —$COR^o$, —$COOR^o$, —$CONHR^o$, and —$CON(R^o)_2$.

It should be understood that the term "electron-donating group" can be used synonymously herein with "electron donor". In particular, an "electron-donating group" or an "electron-donor" refers to a functional group that donates electrons to a neighboring atom more than a hydrogen atom would if it occupied the same position in a molecule. Examples of electron-donating groups include —OH, —$OR^o$, —$NH_2$, —$NHR^o$, —$N(R^o)_2$, and 5-14 membered electron-rich heteroaryl groups, where $R^o$ is a $C_{1-20}$ alkyl group, a $C_{2-20}$ alkenyl group, a $C_{2-20}$ alkynyl group, a $C_{6-14}$ aryl group, or a $C_{3-14}$ cycloalkyl group.

Various unsubstituted heteroaryl groups can be described as electron-rich (or π-excessive) or electron-poor (or π-deficient). Such classification is based on the average electron density on each ring atom as compared to that of a carbon atom in benzene. Examples of electron-rich systems include 5-membered heteroaryl groups having one heteroatom such as furan, pyrrole, and thiophene; and their benzofused counterparts such as benzofuran, benzopyrrole, and benzothiophene. Examples of electron-poor systems include 6-membered heteroaryl groups having one or more heteroatoms such as pyridine, pyrazine, pyridazine, and pyrimidine; as well as their benzofused counterparts such as quinoline, isoquinoline, quinoxaline, cinnoline, phthalazine, naphthyridine, quinazoline, phenanthridine, acridine, and purine. Mixed heteroaromatic rings can belong to either class depending on the type, number, and position of the one or more heteroatom(s) in the ring. See Katritzky, A. R and Lagowski, J. M., *Heterocyclic Chemistry* (John Wiley & Sons, New York, 1960).

At various places in the present specification, substituents are disclosed in groups or in ranges. It is specifically intended that the description include each and every individual sub-combination of the members of such groups and ranges. For example, the term "$C_{1-6}$ alkyl" is specifically intended to individually disclose $C_1$, $C_2$, $C_3$, $C_4$, $C_5$, $C_6$, $C_1$-$C_6$, $C_1$-$C_5$, $C_1$-$C_4$, $C_1$-$C_3$, $C_1$-$C_2$, $C_2$-$C_6$, $C_2$-$C_5$, $C_2$-$C_4$, $C_2$-$C_3$, $C_3$-$C_6$, $C_3$-$C_5$, $C_3$-$C_4$, $C_4$-$C_6$, $C_4$-$C_5$, and $C_5$-$C_6$ alkyl. By way of other examples, an integer in the range of 0 to 40 is specifically intended to individually disclose 0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, and 40, and an integer in the range of 1 to 20 is specifically intended to individually disclose 1, 2, 3, 4, 5, 6, 7, 8, 9, 10, 11, 12, 13, 14, 15, 16, 17, 18, 19, and 20. Additional examples include that the phrase "optionally substituted with 1-5 substituents" is specifically intended to individually disclose a chemical group that can include 0, 1, 2, 3, 4, 5, 0-5, 0-4, 0-3, 0-2, 0-1, 1-5, 1-4, 1-3, 1-2, 2-5, 2-4, 2-3, 3-5, 3-4, and 4-5 substituents.

Compounds described herein can contain an asymmetric atom (also referred as a chiral center) and some of the compounds can contain two or more asymmetric atoms or centers, which can thus give rise to optical isomers (enantiomers) and diastereomers (geometric isomers). The present teachings include such optical isomers and diastereomers, including their respective resolved enantiomerically or diastereomerically pure isomers (e.g., (+) or (−) stereoisomer) and their racemic mixtures, as well as other mixtures of the enantiomers and diastereomers. In some embodiments, optical isomers can be obtained in enantiomerically enriched or pure form by standard procedures known to those skilled in the art, which include, for example, chiral separation, diastereomeric salt formation, kinetic resolution, and asymmetric synthesis. The present teachings also encompass cis- and trans-isomers of compounds containing alkenyl moieties (e.g., alkenes, azo, and imines). It also should be understood that the compounds of the present teachings encompass all possible regioisomers in pure form and mixtures thereof. In some embodiments, the preparation of the present compounds can include separating such isomers using standard separation procedures known to those skilled in the art, for example, by using one or more of column chromatography, thin-layer chromatography, simulated moving-bed chromatography, and high-performance liquid chromatography. However, mixtures of regioisomers can be used similarly to the uses of each individual regioisomer of the present teachings as described herein and/or known by a skilled artisan.

It is specifically contemplated that the depiction of one regioisomer includes any other regioisomers and any regioisomeric mixtures unless specifically stated otherwise.

As used herein, a "leaving group" ("LG") refers to a charged or uncharged atom (or group of atoms) that can be displaced as a stable species as a result of, for example, a substitution or elimination reaction. Examples of leaving groups include, but are not limited to, halogen (e.g., Cl, Br, I), azide ($N_3$), thiocyanate (SCN), nitro ($NO_2$), cyanate (CN), water ($H_2O$), ammonia ($NH_3$), and sulfonate groups (e.g., $OSO_2$—R, wherein R can be a $C_{1-10}$ alkyl group or a $C_{6-14}$ aryl group each optionally substituted with 1-4 groups independently selected from a $C_{1-10}$ alkyl group and an electron-withdrawing group) such as tosylate (toluenesulfonate, OTs), mesylate (methanesulfonate, OMs), brosylate (p-bromobenzenesulfonate, OBs), nosylate (4-nitrobenzenesulfonate, ONs), and triflate (trifluoromethanesulfonate, OTf).

As used herein, a "p-type semiconductor material" or a "donor" material refers to a semiconductor material having holes as the majority current or charge carriers. In some embodiments, when a p-type semiconductor material is deposited on a substrate, it can provide a hole mobility in excess of about $10^{-5}$ cm²/Vs. In the case of field-effect devices, a p-type semiconductor can also exhibit a current on/off ratio of greater than about 10.

As used herein, an "n-type semiconductor material" or an "acceptor" material refers to a semiconductor material having electrons as the majority current or charge carriers. In some embodiments, when an n-type semiconductor material is deposited on a substrate, it can provide an electron mobility in excess of about $10^{-5}$ cm²/Vs. In the case of field-effect devices, an n-type semiconductor can also exhibit a current on/off ratio of greater than about 10.

As used herein, "mobility" refers to a measure of the velocity with which charge carriers, for example, holes (or units of positive charge) in the case of a p-type semiconductor material and electrons in the case of an n-type semiconductor material, move through the material under the influence of an electric field. This parameter, which depends on the device architecture, can be measured using a field-effect device or space-charge limited current measurements.

As used herein, fill factor (FF) is the ratio (given as a percentage) of the actual maximum obtainable power, ($P_m$ or $V_{mp}*J_{mp}$), to the theoretical (not actually obtainable) power, ($J_{sc} \times V_{oc}$). Accordingly, FF can be determined using the equation:

$$FF=(V_{mp}*J_{mp})/(J_{sc}*V_{oc})$$

where $J_{mp}$ and $V_{mp}$ represent the current density and voltage at the maximum power point ($P_m$), respectively, this point being obtained by varying the resistance in the circuit until J*V is at its greatest value; and $J_{sc}$ and $V_{oc}$ represent the short circuit current and the open circuit voltage, respectively. Fill factor is a key parameter in evaluating the performance of solar cells. Commercial solar cells typically have a fill factor of about 0.60% or greater.

As used herein, the open-circuit voltage ($V_{oc}$) is the difference in the electrical potentials between the anode and the cathode of a device when there is no external load connected.

As used herein, the power conversion efficiency (PCE) of a solar cell is the percentage of power converted from absorbed light to electrical energy. The PCE of a solar cell can be calculated by dividing the maximum power point ($P_m$) by the input light irradiance (E, in W/m²) under standard test conditions (STC) and the surface area of the solar cell ($A_c$ in m²). STC typically refers to a temperature of 25° C. and an irradiance of 1000 W/m² with an air mass 1.5 (AM 1.5) spectrum.

As used herein, a component (such as a thin film layer) can be considered "photoactive" if it contains one or more compounds that can absorb photons to produce excitons for the generation of a photocurrent.

As used herein, a compound can be considered "ambient stable" or "stable at ambient conditions" when a transistor incorporating the compound as its semiconducting material exhibits a carrier mobility that is maintained at about its initial measurement when the compound is exposed to ambient conditions, for example, air, ambient temperature, and humidity, over a period of time. For example, a compound can be described as ambient stable if a transistor incorporating the compound shows a carrier mobility that does not vary more than 20% or more than 10% from its initial value after exposure to ambient conditions, including, air, humidity and temperature, over a 3 day, 5 day, or 10 day period.

As used herein, "solution-processable" refers to compounds (e.g., polymers), materials, or compositions that can be used in various solution-phase processes including spin-coating, printing (e.g., inkjet printing, screen printing, pad printing, offset printing, gravure printing, flexographic printing, lithographic printing, mass-printing and the like), spray coating, electrospray coating, drop casting, dip coating, and blade coating.

Throughout the specification, structures may or may not be presented with chemical names. Where any question arises as to nomenclature, the structure prevails.

The present teachings relate to certain oligomeric and polymeric compounds that can be used as organic semiconductors. The present compounds can have good solubility in various common solvents and good stability in air. When incorporated into optical or optoelectronic devices including, but not limited to, photovoltaic or solar cells, light emitting diodes, and light emitting transistors, the present compounds can confer various desirable performance properties. For example, when the present compounds are used in a photoactive layer of a solar cell (e.g., bulk heterojunction devices), the solar cell can exhibit very high power conversion efficiency (e.g., about 4.0% or greater), fill factor (e.g., about 60% or greater), and/or open circuit voltage (e.g., about 0.7 V or greater). The present compounds also can be processed into very efficient solar cells without a thermally annealing step, thus providing time- and cost-saving benefits and allowing a larger variety of materials to be used in various components of the solar cell.

The present teachings provide various conjugated oligomeric and polymeric compounds, where each compound includes at least two different monomeric units. Very generally, the present compounds can be represented by the formula:

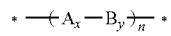

where A and B are different and can be repeated in a random or alternating manner; x and y represent the mole fractions of A and B, respectively, where $0.1 \leq x \leq 0.9$, $0.1 \leq y \leq 0.9$, and the sum of x and y is about 1; and n represents a degree of polymerization in the range from 2 to about 10,000 or greater.

More specifically, the present compounds can be represented by the formula:

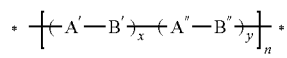

where A' and A" have the definition of A as described above, B' and B" have the definitions of B as described above, provided that A' and A" and/or B' and B" differ from each other in terms of substitution; x and y represent mole fractions, where $0.1 \leq x \leq 0.9$, $0.1 \leq y \leq 0.9$, and the sum of x and y is about 1; and n represents a degree of polymerization in the range from 2 to about 10,000 or greater. For example, one of A' and A" can be substituted with one or more solubilizing groups while the other is unsubstituted. Similarly, one or more moieties in B' can be substituted while the same moieties in B are unsubstituted. In various embodiments, the unit comprising x mole fraction of the compound and the unit comprising y mole fraction of the compound, i.e., the units

*―(A'-B')―and *―(A''-B'')*, can be repeated in a random manner.

For example, the repeat unit A, A', or A'' can include a conjugated polycyclic moiety of the formula:

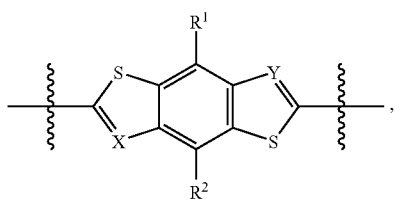

wherein X is N or $CR^3$ and Y is N or $CR^4$, i.e., an optionally substituted benzodithienyl moiety of the formula:

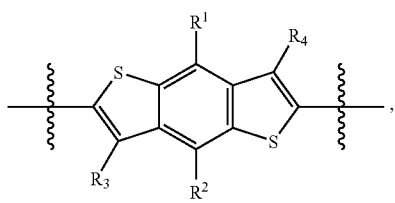

or an optionally substituted benzodithiazolyl moiety of the formula:

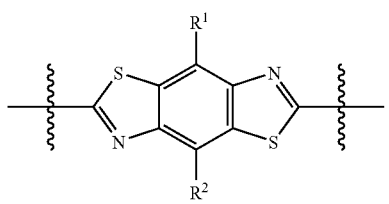

where $R^1$, $R^2$, $R^3$, and $R^4$ independently can be H or a substituent which can impart improved desirable properties to the compound as a whole. For example, certain substituents including one or more electron-withdrawing or electron-donating moieties can modulate the electronic properties of the compound, while substituents that include one or more aliphatic chains can improve the solubility of the compound in organic solvents.

More specifically, each of $R^1$, $R^2$, $R^3$, and $R^4$ independently can be selected from H, a halogen, CN, OR', SR', C(O)R', C(O)OR', $SO_2R'$, a $C_{1-40}$ alkyl group, a $C_{2-40}$ alkenyl group, a $C_{2-40}$ alkynyl group, a $C_{1-40}$ haloalkyl group, a -L'-$C_{3-10}$ cycloalkyl group, a -L'-$C_{6-14}$ aryl group, a -L'-$C_{6-14}$ haloaryl group, a -L'-3-12 membered cycloheteroalkyl group, and a -L'-5-14 membered heteroaryl group;
  wherein:
    L', at each occurrence, independently is selected from a divalent $C_{1-20}$ alkyl group, a divalent $C_{1-20}$ haloalkyl group, and a covalent bond;
    R' is selected from H, a $C_{1-40}$ alkyl group, a $C_{2-40}$ alkenyl group, a $C_{2-40}$ alkynyl group, and a $C_{1-40}$ haloalkyl group;
    each of the $C_{1-40}$ alkyl group, the $C_{2-40}$ alkenyl group, the $C_{2-40}$ alkynyl group, the $C_{1-40}$ haloalkyl group, the $C_{1-20}$ alkyl group, the $C_{1-20}$ haloalkyl group, the $C_{3-10}$ cycloalkyl group, the $C_{6-14}$ aryl group, the $C_{6-14}$ haloaryl group, the 3-12 membered cycloheteroalkyl group, and the 5-14 membered heteroaryl group, optionally can be substituted with 1-10 substituents independently selected from a halogen, —CN, $NO_2$, OH, —$NH_2$, —NH($C_{1-20}$ alkyl), —N($C_{1-20}$ alkyl)$_2$, —S(O)$_2$OH, —CHO, —C(O)—$C_{1-20}$ alkyl, —C(O)OH, —C(O)—O$C_{1-20}$ alkyl, —C(O)$NH_2$, —C(O)NH—$C_{1-20}$ alkyl, —C(O)N($C_{1-20}$ alkyl)$_2$, —O$C_{1-20}$ alkyl, —$SiH_3$, —SiH ($C_{1-20}$ alkyl)$_2$, —$SiH_2$($C_{1-20}$ alkyl), and —Si($C_{1-20}$ alkyl)$_3$; and
    one or more non-adjacent-CH— groups in the $C_{1-40}$ alkyl group, the $C_{2-40}$ alkenyl group, the $C_{2-40}$ alkynyl group, the $C_{1-40}$ haloalkyl group, the $C_{1-20}$ alkyl group, or the $C_{1-20}$ haloalkyl group, can be replaced by a group independently selected from —O—, —S—, —NH—, —N($C_{1-20}$ alkyl)-, —Si($C_{1-20}$ alkyl)$_2$-, —C(O)—, —C(O)O—, —OC(O)—, and —OC(O)O—.

In certain embodiments, at least one of $R^1$, $R^2$, $R^3$, and $R^4$ independently can be a small functional group such as a halogen, CN, OR', C(O)R', C(O)OR', or $SO_2R'$, where R' can be H or a lower alkyl group.

In certain embodiments, at least one of $R^1$, $R^2$, $R^3$, and $R^4$ independently can be a linear or branched $C_{3-40}$ alkyl group, examples of which include an n-hexyl group, an n-octyl group, an n-dodecyl group, a 1-methylpropyl group, a 1-methylbutyl group, a 1-methylpentyl group, a 1-methylhexyl group, a 1-ethylpropyl group, a 1-ethylbutyl group, a 1,3-dimethylbutyl group, a 2-ethylhexyl group, a 2-hexyloctyl group, a 2-octyldodecyl group, and a 2-decyltetradecyl group. In certain embodiments, at least one of $R^1$, $R^2$, $R^3$, and $R^4$ independently can be a linear or branched $C_{3-40}$ alkenyl group (such as the linear or branched $C_{3-40}$ alkyl groups specified above but with one or more saturated bonds replaced by unsaturated bonds). In particular embodiments, at least one of $R^1$, $R^2$, $R^3$, and $R^4$ independently can be a branched $C_{3-20}$ alkyl group or a branched $C_{3-20}$ alkenyl group.

In certain embodiments, at least one of $R^1$, $R^2$, $R^3$, and $R^4$ independently can be a linear or branched $C_{6-40}$ alkyl or alkenyl group, an arylalkyl group (e.g., a benzyl group) substituted with a linear or branched $C_{6-40}$ alkyl or alkenyl group, an aryl group (e.g., a phenyl group) substituted with a linear or branched $C_{6-40}$ alkyl or alkenyl group, or a biaryl group (e.g., a biphenyl group) substituted with a linear or branched $C_{6-40}$ alkyl or alkenyl group, wherein each of these groups optionally can be substituted with 1-5 halo groups (e.g., F). In some embodiments, at least one of $R^1$, $R^2$, $R^3$, and $R^4$ independently can be a biaryl group wherein the two aryl groups are covalently linked via a linker. For example, the linker can be a divalent $C_{1-40}$ alkyl group wherein one or more non-adjacent $CH_2$ groups optionally can be replaced by —O—, —S—, or —Se—, i.e., O, S, and/or Se atoms are not linked directly to one another. The linker can include other heteroatoms and/or functional groups as described herein.

To further illustrate, in certain embodiments, $R^1$, $R^2$, $R^3$, and $R^4$ independently can be selected from H or -L'-$R^a$, where $R^a$ is selected from a $C_{1-40}$ alkyl group, a $C_{2-40}$ alkenyl group, a $C_{2-40}$ alkynyl group, and a $C_{1-40}$ haloalkyl group, each of which optionally can be substituted with 1-10 substituents independently selected from a halogen, —CN, NO$_2$, OH, —NH$_2$, —NH(C$_{1-20}$ alkyl), —N(C$_{1-20}$ alkyl)$_2$, —S(O)$_2$OH, —CHO, —C(O)—C$_{1-20}$ alkyl, —C(O)OH, —C(O)—OC$_{1-20}$ alkyl, —C(O)NH$_2$, —C(O)NH—C$_{1-20}$ alkyl, —C(O)N(C$_{1-20}$ alkyl)$_2$, —OC$_{1-20}$ alkyl, —SiH$_3$, —SiH(C$_{1-20}$ alkyl)$_2$, —SiH$_2$(C$_{1-20}$ alkyl), and —Si(C$_{1-20}$ alkyl)$_3$; and L' is a covalent bond or a linker comprising one or more heteroatoms. For example, L' can be a linker selected from —Y—O—Y, —Y—[S(O)$_w$]—Y—, —Y—C(O)—Y—, —Y—[NR$^c$C(O)]—Y—, —Y—[C(O)NR$^c$]—, —Y—NR$^c$—Y—, —Y—[SiR$^c$$_2$]—Y—, where Y, at each occurrence, independently is selected from a divalent C$_{1-20}$ alkyl group, a divalent C$_{2-20}$ alkenyl group, a divalent C$_{2-20}$ haloalkyl group, and a covalent bond; R$^c$ is selected from H, a C$_{1-6}$ alkyl group, a C$_{6-14}$ aryl group, and a —C$_{1-6}$ alkyl-C$_{6-14}$ aryl group; and w is 0, 1, or 2. In some embodiments, R$^1$, R$^2$, R$^3$, and R$^4$ independently can be selected from H, a C$_{3-40}$ alkyl group, an —O—C$_{3-40}$ alkyl group, an —S—C$_{3-40}$ alkyl group, a C$_{4-40}$ alkenyl group, a C$_{4-40}$ alkynyl group, and a C$_{3-40}$ haloalkyl group, where each of these groups can be linear or branched, and optionally can be substituted as described herein.

In other embodiments, one or more of R$^1$, R$^2$, R$^3$, and R$^4$ independently can include one or more cyclic moieties.

In various embodiments, the conjugated polycyclic moiety:

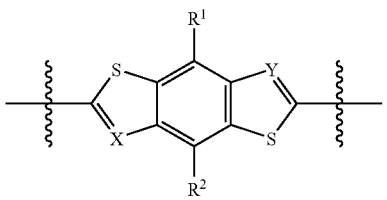

can be symmetrically substituted, that is, R$^1$ and R$^2$ can be identical groups, and/or when X and Y are CR$^3$ and CR$^4$, respectively, R$^3$ and R$^4$ can be identical groups. For example, each of R$^1$ and R$^2$ and/or each of R$^3$ and R$^4$ can be a branched C$_{3-40}$ alkyl group, a branched C$_{3-40}$ haloalkyl group, a branched C$_{3-40}$ alkoxy group, or a branched C$_{3-40}$ alkylthio group.

The repeat unit B, B', or B'' in the present oligomeric or polymeric compounds can have the formula:

—(Ar)-M-(Ar)— where each Ar can be an optionally substituted 5-10 membered aryl or heteroaryl group; and M can be an optionally substituted benzofused heteroaryl moiety as described herein.

Accordingly, in some embodiments, compounds according to the present teachings can be represented by formula I:

wherein:

each M is an optionally substituted benzofused heteroaryl moiety comprising 1-6 heteroatoms;

X is N or CR$^3$;

Y is N or CR$^4$;

each of R$^1$, R$^2$, R$^3$ and R$^4$ independently is selected from H and -L-R, wherein:

L, at each occurrence, independently is selected from O, S, and a covalent bond; and R, at each occurrence, independently is a C$_{1-40}$ alkyl group;

R$^7$, at each occurrence, independently is selected from a C$_{1-40}$ alkyl group, a C$_{1-40}$ haloalkyl group, a C$_{1-40}$ alkoxy group, and a C$_{1-40}$ alkylthio group; and x and y are real numbers representing mole fractions, wherein $0.1 \leq x \leq 0.9$, $0.1 \leq y \leq 0.9$, and the sum of x and y is about 1.

For example, the optionally substituted benzofused heteroaryl moiety can be represented by the formula:

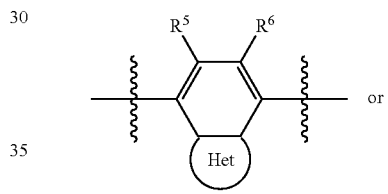 or

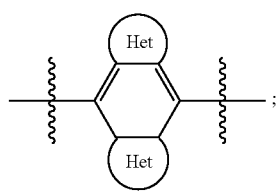

wherein Het, at each occurrence, is a monocyclic moiety including at least one heteroatom in its ring, and R$^5$ and R$^6$ independently can be H or -L-R, where L and R are as defined herein.

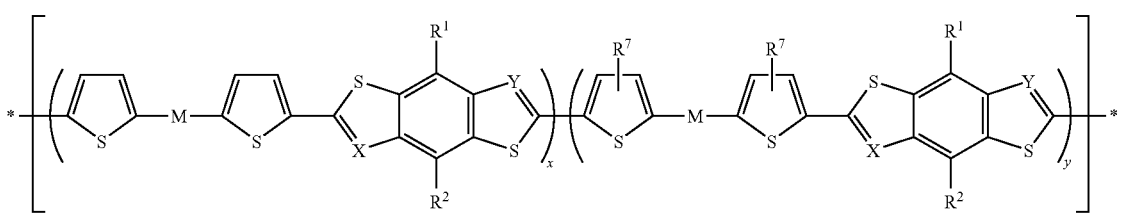

To illustrate, M can be selected from:

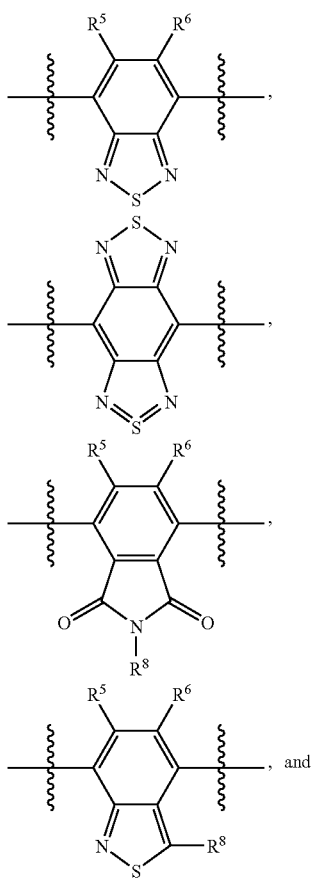

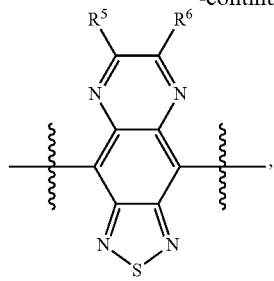

wherein $R^8$ is H or a $C_{1-40}$ alkyl group, and $R^5$ and $R^6$ are as defined herein.

In particular embodiments, M can be selected from:

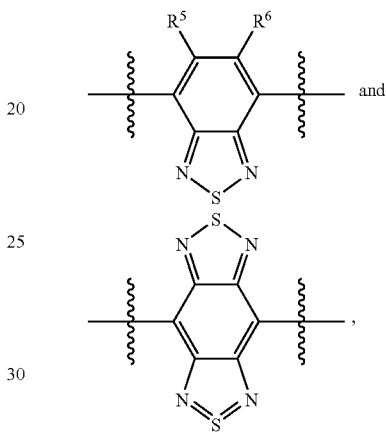

wherein $R^5$ and $R^6$ are as defined herein. For example, $R^5$ and $R^6$ can be H or a $C_{1-40}$ alkyl group.

Accordingly, in certain embodiments, copolymers according to the present teachings can be represented by Formula II:

II

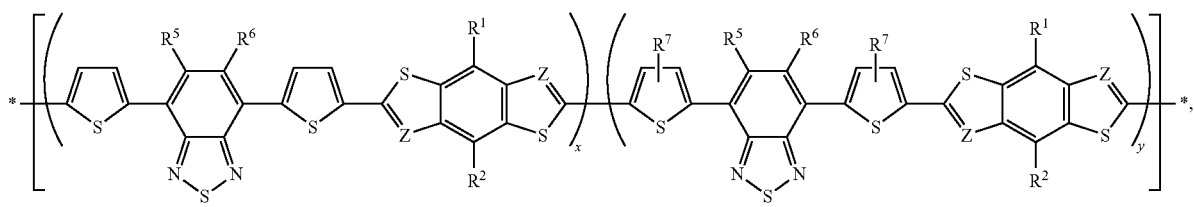

wherein $R^1$, $R^2$, $R^5$, $R^6$, $R^7$, Z, x and y are as defined herein. For example, $R^5$ and $R^6$ independently can be H or a $C_{1-40}$ alkyl group; and each $R^7$ can be a $C_{1-40}$ alkyl group or a $C_{1-40}$ alkoxy group.

In particular embodiments, certain copolymers according to the present teachings can be represented by Formula III:

III

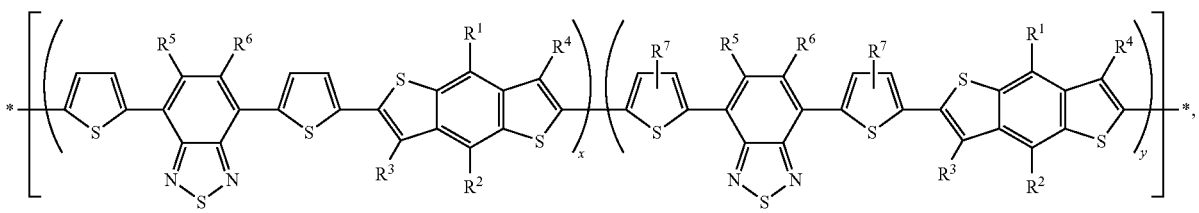

wherein $R^1$, $R^2$, $R^3$, $R^4$, $R^5$, $R^6$, $R^7$, x and y are as defined herein. For example, $R^5$ and $R^6$ independently can be H or a $C_{1-40}$ alkyl group; and each $R^7$ can be a $C_{1-40}$ alkyl group or a $C_{1-40}$ alkoxy group. To further illustrate, compounds of formula III can be represented by a formula selected from:

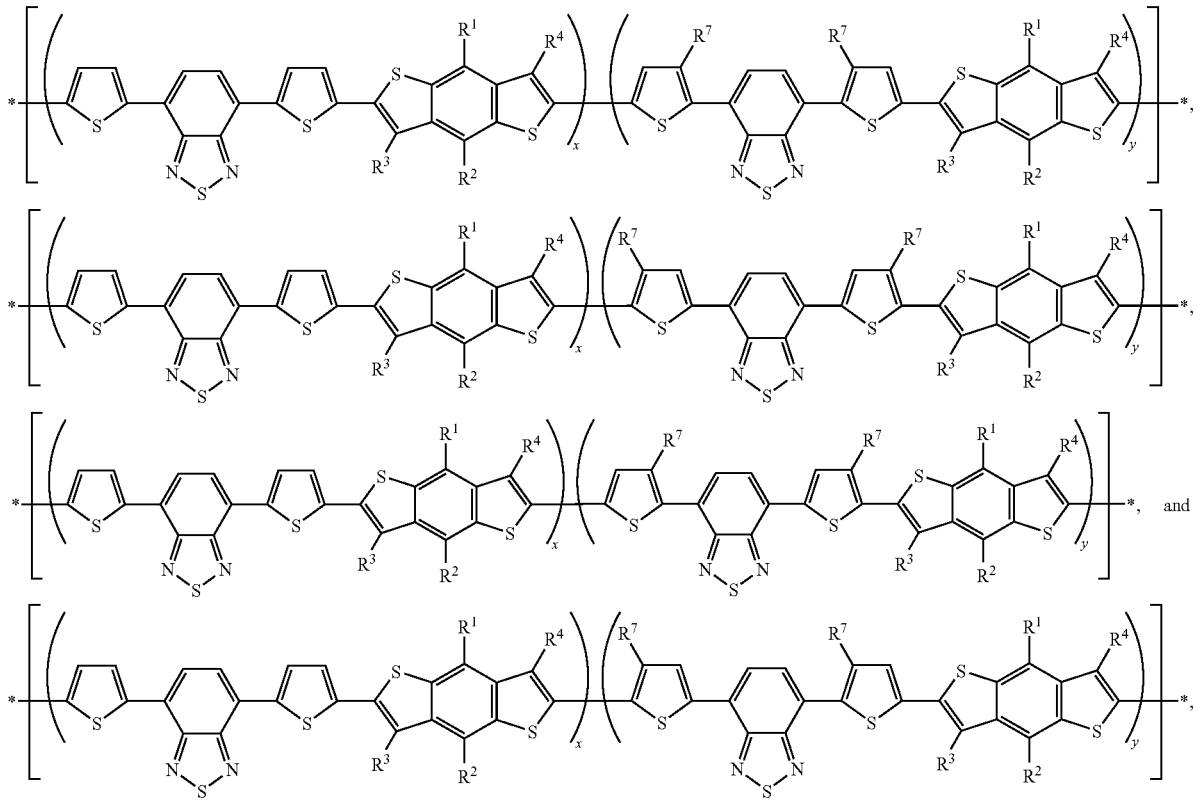

wherein $R^1$, $R^2$, $R^3$, $R^4$, $R^7$, x and y are as defined herein. In some embodiments, $R^3$ and $R^4$ can be H, and $R^1$ and $R^2$ can be -L-R, wherein L and R are as defined herein. In other embodiments, $R^1$ and $R^2$ can be H, and $R^3$ and $R^4$ can be -L-R, wherein L and R are as defined herein. For example, -L-R can be selected from a $C_{3-40}$ alkyl group (R), a $C_{3-40}$ alkoxy group (—O—R), and a $C_{3-40}$ alkylthio group (—S—R).

In certain embodiments, copolymers of the present teachings can be represented by formula IV:
including a formula selected from:

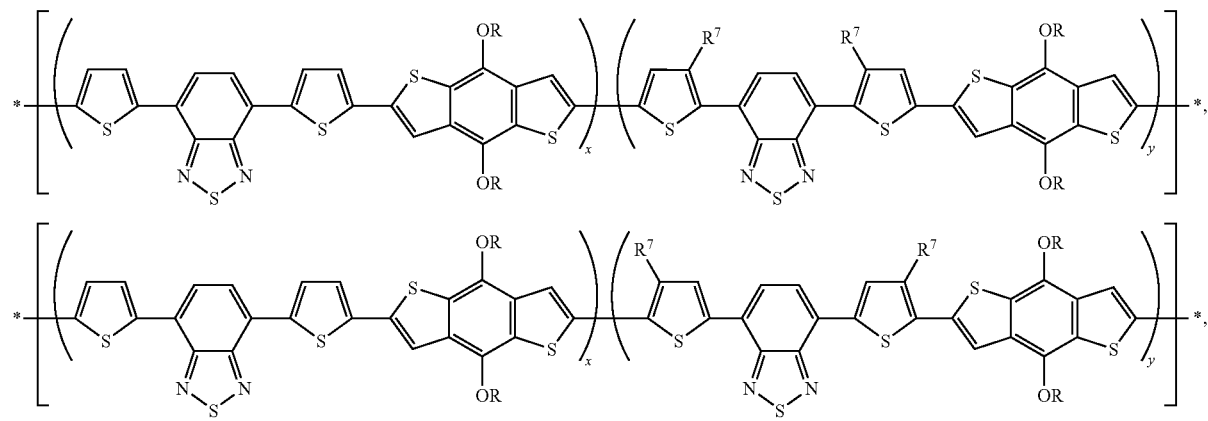

-continued

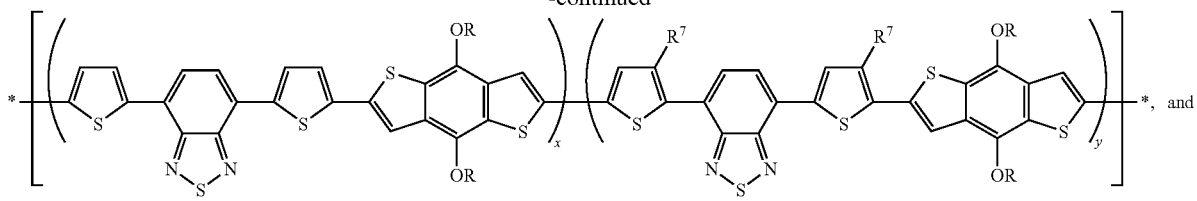
, and

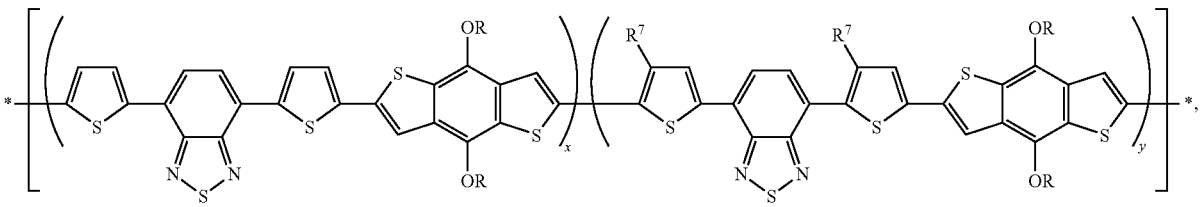
, wherein R is a $C_{1-40}$ alkyl group, and $R^7$, x and y are as defined herein. For example, in some embodiments, R can be a branched $C_{6-20}$ alkyl group, $R^7$ can be a linear $C_{6-20}$ alkyl group. In other embodiments, R can be a branched $C_{6-20}$ alkyl group, $R^7$ can be a linear $C_{6-20}$ alkoxy group. The mole fractions x and y, respectively, can range between about 0.2 and about 0.8, i.e., $0.2 \leq x \leq 0.8$ and $0.2 \leq y \leq 0.8$, provided that the sum of x and y is about 1.

To further illustrate, certain copolymers of formula IV can be represented by a formula selected from:

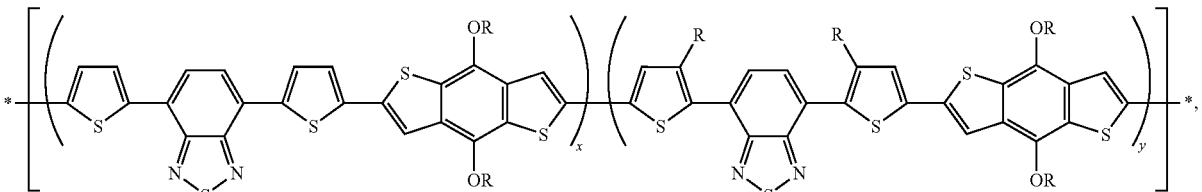
,

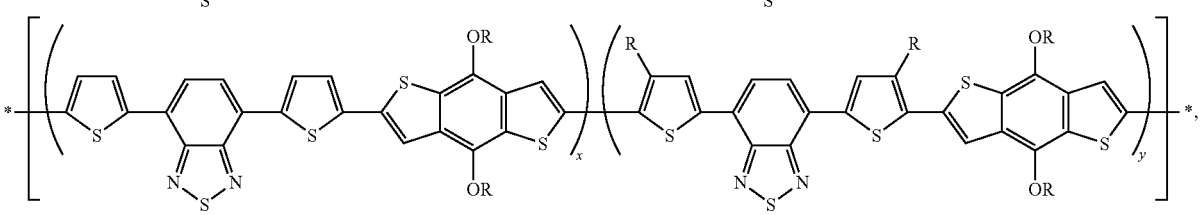
,

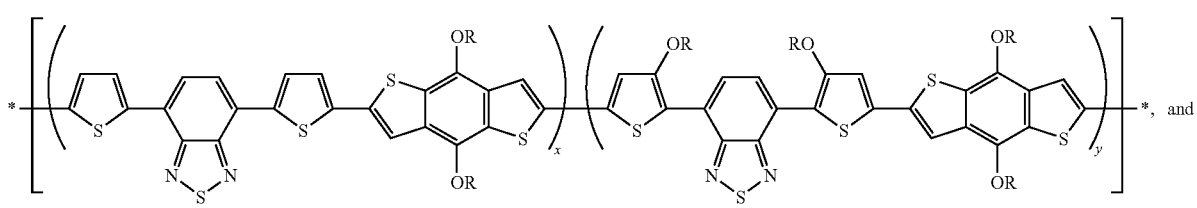
, and

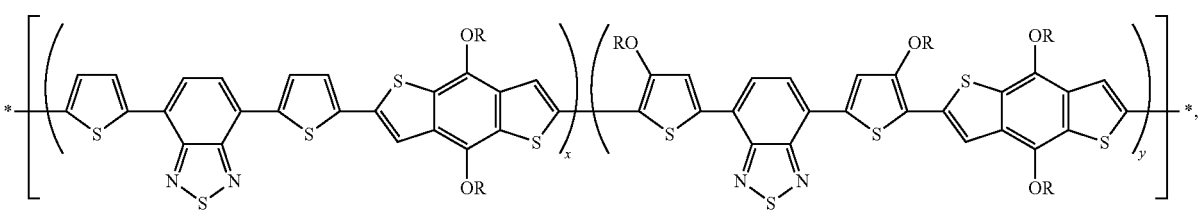
, wherein R, at each occurrence, independently can be a $C_{6-20}$ alkyl group, and x and y are as defined herein.

In certain embodiments, copolymers of the present teachings can be represented by formula V:

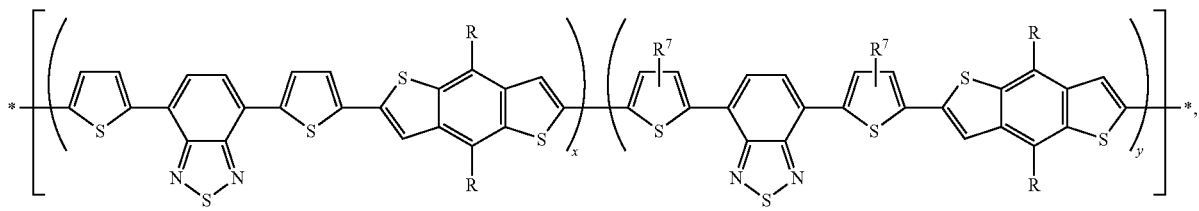

including a formula selected from:

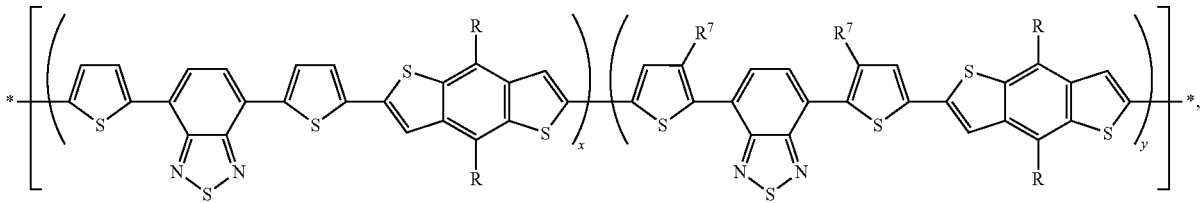

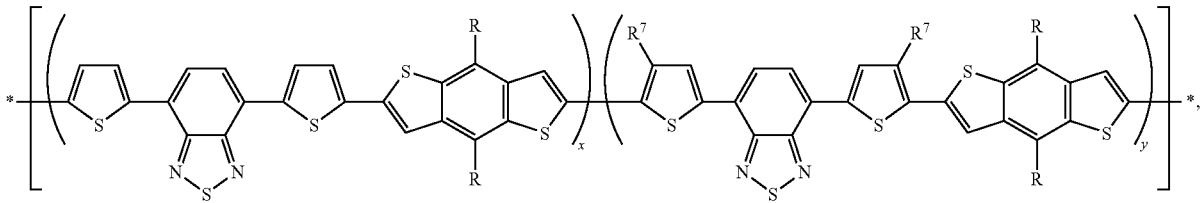

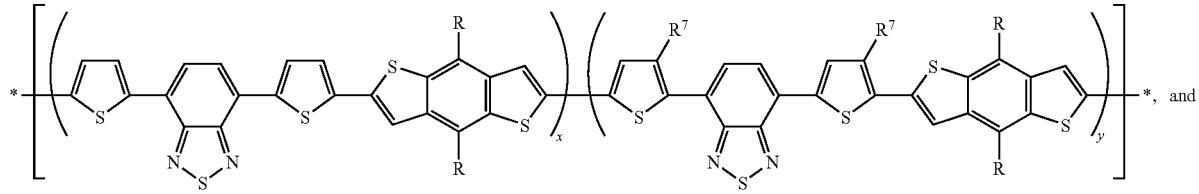

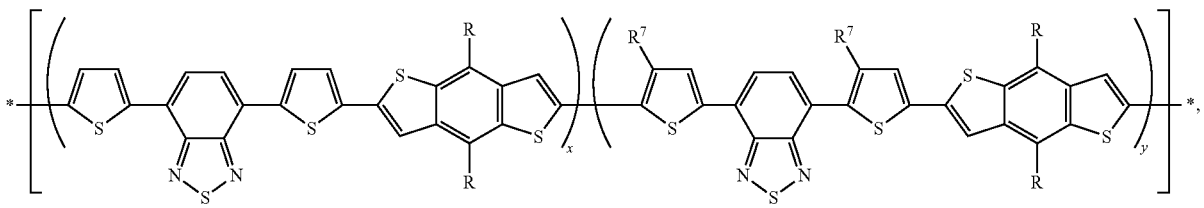

wherein R is a $C_{1-40}$ alkyl group, and $R^7$, x and y are as defined herein. For example, in some embodiments, R can be a branched $C_{6-20}$ alkyl group, $R^7$ can be a linear $C_{6-20}$ alkyl group. In other embodiments, R can be a branched $C_{6-20}$ alkyl group, $R^7$ can be a linear $C_{6-20}$ alkoxy group. The mole fractions x and y, respectively, can range between about 0.2 and about 0.8, i.e., $0.2 \leq x \leq 0.8$ and $0.2 \leq y \leq 0.8$, provided that the sum of x and y is about 1.

To further illustrate, certain copolymers of formula V can be represented by a formula selected from:

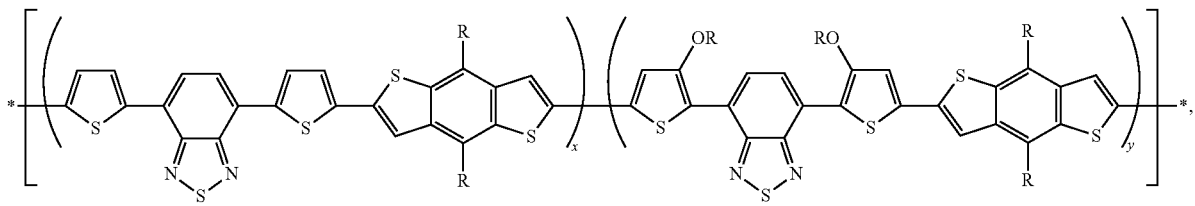

-continued

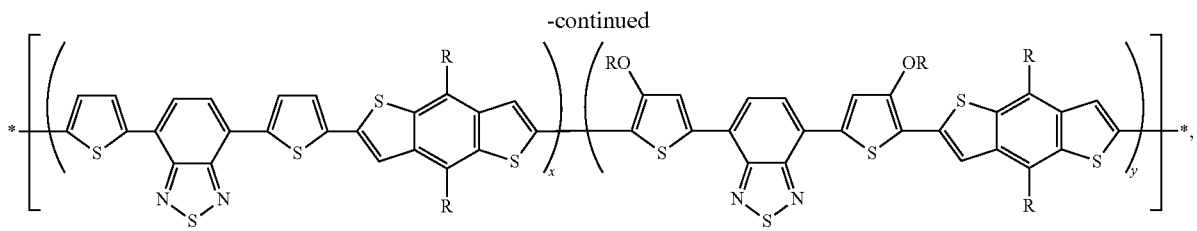

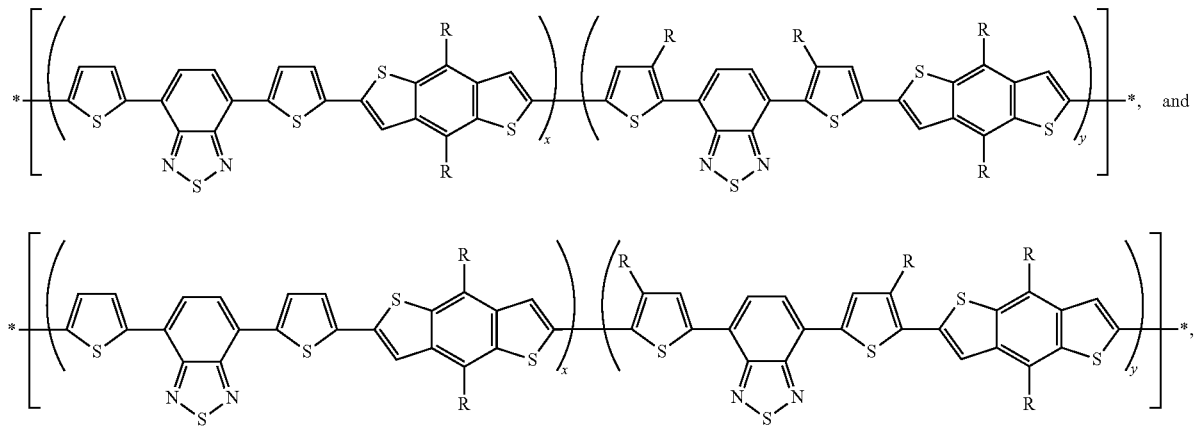
and wherein R, at each occurrence, independently can be a $C_{6-20}$ alkyl group, and x and y are as defined herein.

In certain embodiments, the optionally substituted benzodithienyl or benzodithiazolyl groups in formula I can be replaced by another optionally substituted conjugated polycyclic moiety [π-2], where [π-2] is incorporated into the backbone of the compound via atoms belonging to two different rings. That is, the A' and A" groups can be an optionally substituted benzodithienyl or benzodithiazolyl group or some other optionally substituted conjugated polycyclic moiety [π-2].

For example, [π-2] can be an optionally substituted polycyclic moiety selected from:

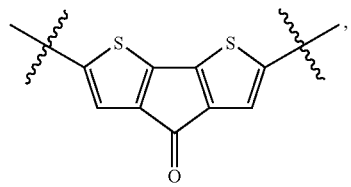

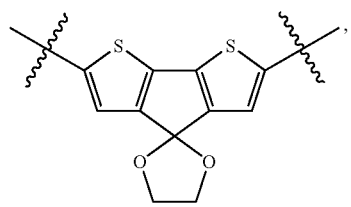

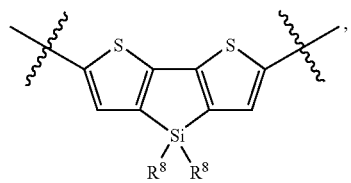

-continued

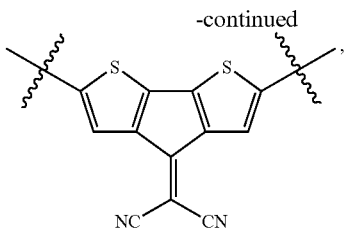

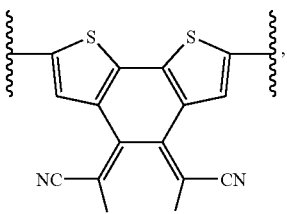

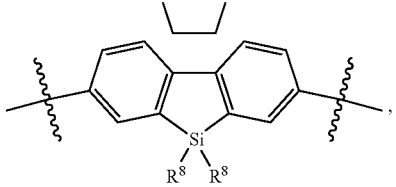

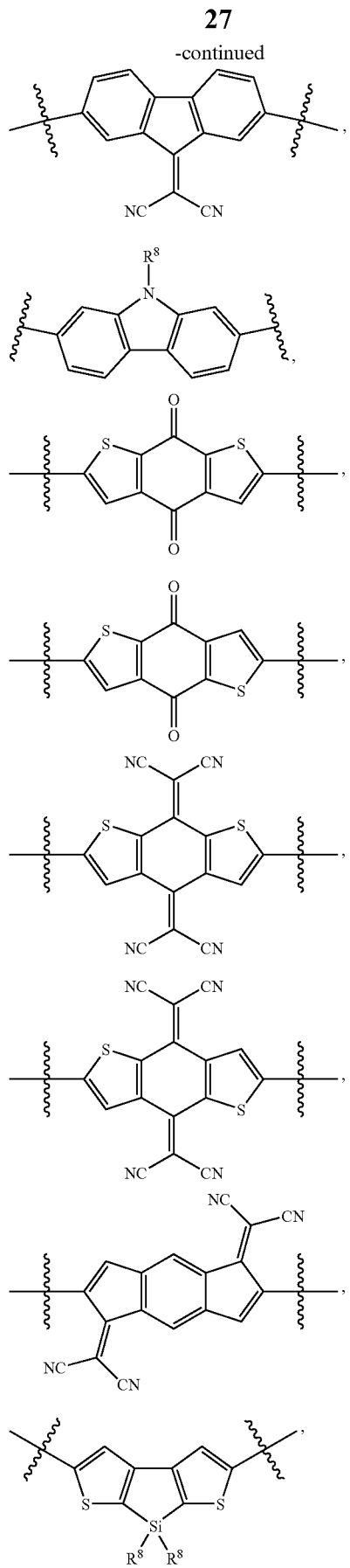

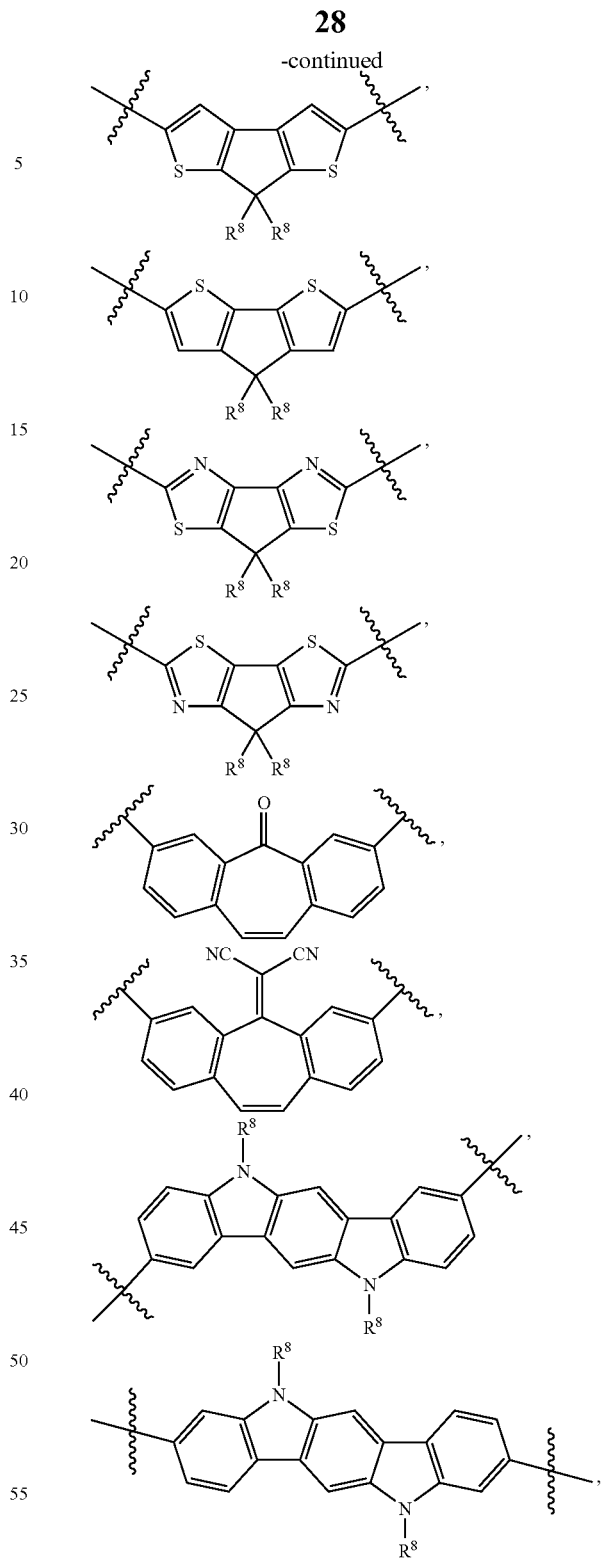

where $R^8$, at each occurrence, independently can be H or a $C_{1-40}$ alkyl group.

In the various copolymers described herein (including compounds of formulae I, II, III, IV, and V), the unit comprising x mole fraction of the copolymer and the unit comprising y mole fraction of the copolymer can be repeated in a random manner. In addition, in these compounds, the unit comprising x mole fraction of the copolymer (i.e., the unit including the unsubstituted thienyl groups) can be present at a higher mole fraction than the unit comprising y mole fraction of the copolymer (i.e., the unit including the substituted thienyl groups). More specifically, x can be at least about 0.5, that is, $0.5 \leq x \leq 0.9$ and $0.1 \leq y \leq 0.5$, where the sum of x and y is about 1. In particular embodiments, x and y can be real numbers in the range of $0.5 \leq x \leq 0.8$ and $0.2 \leq y \leq 0.5$, where the sum of x and y is about 1. Further, the degree of polymerization (n) can be in the range from 5 to about 10,000. For example, the degree of polymerization (n) can be in the range from 10 to about 10,000.

The inventors surprisingly have found that the compounds of formulae I, II, III, IV, and V can provide exceptional performance improvements in organic photovoltaic devices. The performance improvements can include high power conversion efficiency (e.g., about 4.0% or greater, about 4.5% or greater, about 5.0% or greater, or about 5.5% or greater), low band-gap (e.g., about 1.60 eV or lower, about 1.55 eV or lower, or about 1.50 eV or lower), high fill factor (e.g., about 60% or greater, about 65% or greater, or about 70% or greater), and/or high open circuit voltage (e.g., about 0.6 V or greater, about 0.7 V or greater, or about 0.8 V or greater). More surprisingly, the inventors have observed that when a compound of formula I, II, III, IV, or V is used in the photoactive material of a photovoltaic device, the performance of the device often is markedly better than a comparative device incorporating a copolymer of either the unit comprising x mole fraction of the copolymer (i.e., the unit including the unsubstituted thienyl groups) alone or a copolymer of the unit comprising y mole fraction of the copolymer (i.e., the unit including the substituted thienyl groups) alone, but not a copolymer of both units as in the present copolymers. The performance improvements can include higher power conversion efficiency, lower band-gap, higher fill factor, and/or higher open circuit voltage compared to the comparative device. In certain embodiments, improvements in band-gap, fill factor and open circuit voltage are observed simultaneously in the same device using a copolymer according to the present teachings. In certain embodiments, improvements in at least three of the four criteria are observed. In particular embodiments, improvements in all four criteria are observed.

Compounds of the present teachings and monomers leading to the present compounds can be prepared according to procedures analogous to those described in the Examples. In particular, Stille coupling or Suzuki coupling reactions can be used to prepare co-polymeric compounds according to the present teachings with high molecular weights and in high yields ($\geq 75\%$) and purity, as confirmed by $^1$H NMR spectra, elemental analysis, and/or GPC measurements.

Alternatively, the present compounds can be prepared from commercially available starting materials, compounds known in the literature, or via other readily prepared intermediates, by employing standard synthetic methods and procedures known to those skilled in the art. Standard synthetic methods and procedures for the preparation of organic molecules and functional group transformations and manipulations can be readily obtained from the relevant scientific literature or from standard textbooks in the field. It will be appreciated that where typical or preferred process conditions (i.e., reaction temperatures, times, mole ratios of reactants, solvents, pressures, etc.) are given, other process conditions can also be used unless otherwise stated. Optimum reaction conditions can vary with the particular reactants or solvent used, but such conditions can be determined by one skilled in the art by routine optimization procedures. Those skilled in the art of organic synthesis will recognize that the nature and order of the synthetic steps presented can be varied for the purpose of optimizing the formation of the compounds described herein.

The processes described herein can be monitored according to any suitable method known in the art. For example, product formation can be monitored by spectroscopic means, such as nuclear magnetic resonance spectroscopy (NMR, e.g., $^1$H or $^{13}$C), infrared spectroscopy (IR), optical absorption/emission spectroscopy (e.g., UV-visible), mass spectrometry (MS), or by chromatography such as high pressure liquid chromatography (HPLC), gas chromatography (GC), gel-permeation chromatography (GPC), or thin layer chromatography (TLC).

The reactions or the processes described herein can be carried out in suitable solvents which can be readily selected by one skilled in the art of organic synthesis. Suitable solvents typically are substantially nonreactive with the reactants, intermediates, and/or products at the temperatures at which the reactions are carried out, i.e., temperatures that can range from the solvent's freezing temperature to the solvent's boiling temperature. A given reaction can be carried out in one solvent or a mixture of more than one solvent. Depending on the particular reaction step, suitable solvents for a particular reaction step can be selected.

Certain embodiments disclosed herein can be stable in ambient conditions ("ambient stable") and soluble in common solvents. As used herein, a compound can be considered electrically "ambient stable" or "stable at ambient conditions" when a transistor incorporating the compound as its semiconducting material exhibits a carrier mobility that is maintained at about its initial measurement when the compound is exposed to ambient conditions, for example, air, ambient temperature, and humidity, over a period of time. For example, a compound according to the present teachings can be described as ambient stable if a transistor incorporating the compound shows a carrier mobility that does not vary more than 20% or more than 10% from its initial value after exposure to ambient conditions, including, air, humidity and temperature, over a 3 day, 5 day, or 10 day period. In addition, a compound can be considered ambient stable if the optical absorption of the corresponding film does not vary more than 20% (preferably, does not vary more than 10%) from its initial value after exposure to ambient conditions, including air, humidity and temperature, over a 3 day, 5 day, or 10 day period.

As used herein, a compound can be considered soluble in a solvent when at least 0.1 mg of the compound can be dissolved in 1 mL of the solvent. Examples of common organic solvents include petroleum ethers; acetonitrile; aromatic hydrocarbons such as benzene, toluene, xylene, and mesitylene; ketones such as acetone, and methyl ethyl ketone; ethers such as tetrahydrofuran, dioxane, bis(2-methoxyethyl)ether, diethyl ether, di-isopropyl ether, and t-butyl methyl ether; alcohols such as methanol, ethanol, butanol, and isopropyl alcohol; aliphatic hydrocarbons such as hexanes; esters such as methyl acetate, ethyl acetate, methyl formate, ethyl formate, isopropyl acetate, and butyl acetate; amides such as dimethylformamide and dimethylacetamide; sulfoxides such as dimethylsulfoxide; halogenated aliphatic and aromatic hydrocarbons such as dichloromethane, chloroform, ethylene chloride, chlorobenzene, dichlorobenzene, and trichlorobenzene; and cyclic solvents such as cyclopentanone, cyclohexanone, and 2-methypyrrolidone.

The present compounds can be fabricated into various articles of manufacture using solution processing techniques in addition to other more expensive processes such as vapor deposition. Various solution processing techniques have been used with organic electronics. Common solution processing techniques include, for example, spin coating, drop-casting, zone casting, dip coating, blade coating, or spraying. Another example of solution processing technique is printing. As used herein, "printing" includes a noncontact process such as ink-jet printing, microdispensing and the like, and a contact process such as screen-printing, gravure printing, offset printing, flexographic printing, lithographic printing, pad printing, microcontact printing and the like.

Compounds of the present teachings can be used alone or in combination with other compounds to prepare semiconductor materials (e.g., compositions and composites), which in turn can be used to fabricate various articles of manufacture, structures, and devices. In some embodiments, semiconductor materials incorporating one or more compounds of the present teachings can exhibit p-type semiconductor activity, ambipolar activity, light absorption, and/or light emission.

The present teachings, therefore, further provide methods of preparing a semiconductor material. The methods can include preparing a composition (e.g., a solution or dispersion) that includes one or more compounds disclosed herein dissolved or dispersed in a liquid medium such as a solvent or a mixture of solvents, depositing the composition on a substrate to provide a semiconductor material precursor, and processing (e.g., heating) the semiconductor precursor to provide a semiconductor material (e.g., a photoactive layer) that includes a compound disclosed herein. In various embodiments, the liquid medium can be an organic solvent, an inorganic solvent such as water, or combinations thereof. In some embodiments, the composition can further include one or more additives independently selected from viscosity modulators, detergents, dispersants, binding agents, compatibilizing agents, curing agents, initiators, humectants, antifoaming agents, wetting agents, pH modifiers, biocides, and bacteriostats. For example, surfactants and/or polymers (e.g., polystyrene, polyethylene, poly-alpha-methylstyrene, polyisobutene, polypropylene, polymethylmethacrylate, and the like) can be included as a dispersant, a binding agent, a compatibilizing agent, and/or an antifoaming agent. In some embodiments, the depositing step can be carried out by printing, including inkjet printing and various contact printing techniques (e.g., screen-printing, gravure printing, offset printing, pad printing, lithographic printing, flexographic printing, and microcontact printing). In other embodiments, the depositing step can be carried out by spin coating, drop-casting, zone casting, dip coating, blade coating, or spraying.

Various articles of manufacture including optical devices, optoelectronic devices, and electronic devices such as thin film semiconductors, photovoltaic devices, photodetectors, organic light emitting devices such as organic light emitting transistors (OLETs), that make use of the compounds disclosed herein are within the scope of the present teachings as are methods of making the same. The present compounds can offer processing and operation advantages in the fabrication and/or the use of these devices.

For example, articles of manufacture such as the various devices described herein can be an optical or optoelectronic device including a first electrode, a second electrode, and a photoactive component disposed between the first electrode and the second electrode, where the photoactive component includes a compound of the present teachings.

In various embodiments, the optical or optoelectronic device can be configured as a solar cell, in particular, a bulk heterojunction solar cell. Compounds of the present teachings can exhibit broad optical absorption and/or a tuned redox properties and bulk carrier mobilities, making them desirable for such applications. In various embodiments, the bulk heterojunction solar cells according to the present teachings can incorporate a blend material (e.g., a blended film) including a compound of the present teachings as the donor material and an acceptor material as the photoactive layer. While in most state-of-the-art devices, the thickness of the blended film often is limited to about 100 nm or less (to obtain good device performance), the inventors have observed comparable performance with films prepared from the copolymers described herein in a broad thickness range, specifically, with thin films having a thickness of about 100 nm or less, as well as films having a thickness greater than about 200 nm.

Typical acceptor materials include fullerene-based compounds. Fullerenes useful in the present teachings can have a broad range of sizes (number of carbon atoms per molecule). The term fullerene as used herein includes various cage-like molecules of pure carbon, including Buckministerfullerene ($C_{60}$) "bucky ball" and the related "spherical" fullerenes as well as carbon nanotubes. Fullerenes can be selected from those known in the art ranging from, for example, C20-C1000. In certain embodiments, the fullerene can be selected from the range of C60 to C96. In particular embodiments, the fullerene can be C60 or C70, such as [60]PCBM, or [70] PCBM. In some embodiments, chemically modified fullerenes can be used, provided that the modified fullerene retains acceptor-type and electron mobility characteristics. Other acceptor materials can be used in place of fullerenes, provided that they have the required acceptor-type and electron mobility characteristics. For example, the acceptor material can be various organic small molecules, polymers, carbon nanotubes, or inorganic particles (quantum dots, quantum rods, quantum tripods, $TiO_2$, ZnO etc.).

A photoactive component according to the present teachings can be prepared as a blended film deposited from a solution or dispersion containing a mixture of one or more of the present compounds and an acceptor compound such as fullerene (e.g., PCBM). The ratio of the present polymer to the acceptor compound can range from about 10:1 to about 1:10 by weight; for example, from about 5:1 to about 1:5 by weight, from about 3:1 to about 1:3 by weight, or from about 2:1 to about 1:2 by weight. The photoactive layer also can contain a polymeric binder, which can be present from about 5 to about 95% by weight. The polymeric binder, for example, can be a semicrystalline polymer selected from polystyrene (PS), high density polyethylene (HDPE), polypropylene (PP) and polymethylmethacrylate (PMMA).

FIG. 1 illustrates a representative structure of a bulk-heterojunction organic solar cell which can incorporate one or more compounds of the present teachings as the donor and/or acceptor materials. As shown, a representative solar cell generally includes a substrate 20, an anode 22, a cathode 26, and a photoactive layer 24 between the anode and the cathode that can incorporate one or more compounds of the present teachings as the electron donor (p-channel) and/or electron acceptor (n-channel) materials. In some embodiments, an optional smoothing layer can be present between the anode and the photoactive layer.

The substrate can be, for example, glass or a flexible substrate (e.g., plastic). The electrodes can be composed of metals or transparent conducting oxides such as indium tin oxide (ITO), gallium indium tin oxide (GITO), and zinc indium tin oxide (ZITO). For example, the cathode can be composed of aluminum or calcium, while the anode can be composed of ITO.

In various embodiments, an optional smoothing layer can be present between the anode and the photoactive layer. For example, the smoothing layer can include a film of 3,4-polyethylenedioxythiophene (PEDOT), or 3,4-polyethylenedioxythiophene:polystyrene-sulfonate (PEDOT:PSS).

In certain embodiments, a solar cell according to the present teachings can include a transparent glass substrate onto which an electrode layer (anode) made of indium tin oxide (ITO) is applied. This electrode layer can have a relatively rough surface, and a smoothing layer made of a polymer, typically PEDOT:PSS made electrically conductive through doping, can be applied on top of the electrode layer to enhance its surface morphology. The photoactive layer generally is made of two components as described above, and can have a layer thickness of, e.g., about 100 nm to a few μm. Before a counter electrode is applied (cathode), an electrically insulating transition layer can be applied onto the photoactive layer. This transition layer can be made of an alkali halogenide, e.g., LiF, and can be vapor-deposited in vacuum.

Another aspect of the present teachings relates to methods of fabricating an organic light-emitting transistor or an organic light-emitting diode (OLED) that incorporates one or more semiconductor materials of the present teachings. For example, in an OLED, one or more compounds of the present teachings can be used as electron-transporting and/or emissive and/or hole-transporting materials. An OLED generally includes a substrate, a transparent anode (e.g., ITO), a cathode (e.g., metal), and one or more organic layers which can incorporate one or more compounds of the present teachings as hole-transporting (p-channel) and/or emissive and/or electron-transporting (n-channel) materials. In embodiments where the present compounds only have one or two of the properties of hole transport, electron transport, and emission, the present compounds can be blended with one or more further organic compounds having the remaining required property or properties.

In other embodiments, the article of manufacture can be an electronic or optoelectronic device (e.g., an organic light-emitting transistor) including a first electrode, a second electrode, and a semiconducting component in contact with the first electrode and the second electrode, where the semiconducting component includes a compound of the present teachings. These devices can include a composite having a semiconducting component (or semiconductor material) of the present teachings and a substrate component and/or a dielectric component. The substrate component can be selected from doped silicon, an indium tin oxide (ITO), ITO-coated glass, ITO-coated polyimide or other plastics, aluminum or other metals alone or coated on a polymer or other substrate, a doped polythiophene, and the like. The dielectric component can be prepared from inorganic dielectric materials such as various oxides (e.g., $SiO_2$, $Al_2O_3$, $HfO_2$), organic dielectric materials such as various polymeric materials (e.g., polycarbonate, polyester, polystyrene, polyhaloethylene, polyacrylate), and self-assembled superlattice/self-assembled nanodielectric (SAS/SAND) materials (e.g., as described in Yoon, M-H. et al., *PNAS*, 102 (13): 4678-4682 (2005), the entire disclosure of which is incorporated by reference herein), as well as hybrid organic/inorganic dielectric materials (e.g., described in U.S. patent application Ser. No. 11/642,504, the entire disclosure of which is incorporated by reference herein). In some embodiments, the dielectric component can include the crosslinked polymer blends described in U.S. patent application Ser. Nos. 11/315,076, 60/816,952, and 60/861,308, the entire disclosure of each of which is incorporated by reference herein. The composite also can include one or more electrical contacts. Suitable materials for the source, drain, and gate electrodes include metals (e.g., Au, Al, Ni, Cu), transparent conducting oxides (e.g., ITO, IZO, ZITO, GZO, GIO, GITO), and conducting polymers (e.g., poly(3,4-ethylenedioxythiophene) poly(styrenesulfonate) (PEDOT:PSS), polyaniline (PANI), polypyrrole (PPy)). One or more of the composites described herein can be embodied within various organic electronic, optical, and optoelectronic devices such as organic photovoltaics (OPV) and organic light-emitting transistors (OLETs) as described above.

The following examples are provided to illustrate further and to facilitate the understanding of the present teachings and are not in any way intended to limit the invention.

All reagents were purchased from commercial sources and used without further purification unless otherwise noted. Specifically, dioxane, dichlorobenzene (DCB), chloroform ($CHCl_3$), and other chlorinated hydrocarbons (CHCs) used for dielectric and semiconductor formulations were purchased from Sigma Aldrich and distilled before use. Anhydrous tetrahydrofuran (THF) was distilled from Na/benzophenone. Conventional Schlenk techniques were used and reactions were carried out under $N_2$ unless otherwise noted.

Characterization data are provided in some cases by $^1$H-NMR, $^{13}$C-NMR, and/or elemental analysis. NMR spectra were recorded on an Inova 500 NMR spectrometer (1H, 500 MHz). Elemental analyses were performed by Midwest Microlab, LLC. Polymer molecular weights were determined on a Waters GPC system (Waters Pump 510) in THF at room temperature versus polystyrene standards.

Example 1

Synthesis of Monomers

Example 1a

Preparation of 4,8-didodecyl-2,6-bis-trimethylstannylbenzo[1,2-b:4,5-b']dithiophene

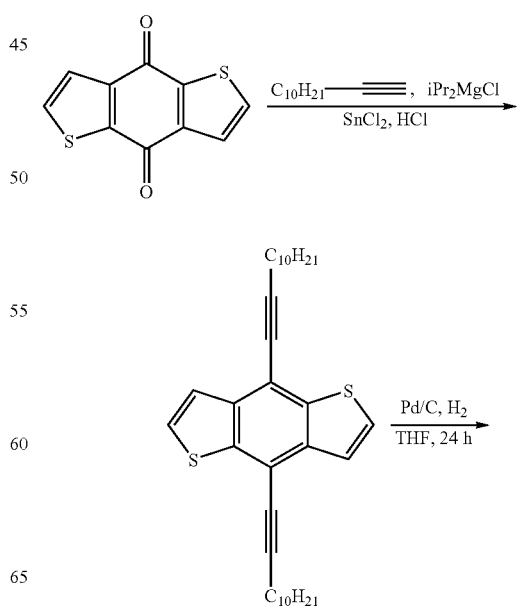

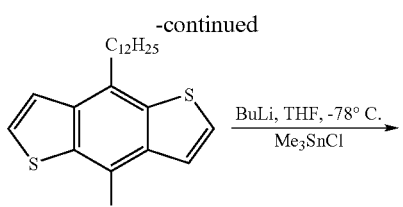

Step 1: Preparation of 4,8-didodecynylbenzo[1,2-b:4,5-b']dithiophene. To a solution of dodecyne (17.5 mL, 81.7 mmol) in THF (20 mL) in a 250 mL flask equipped with a condenser under an argon atmosphere was added dropwise 36 mL (72 mmol) of a 2 M solution of isopropylmagnesium chloride in THF at room temperature. After addition, the reaction mixture was heated at 50° C. for 95 min and cooled to room temperature. 4,8-Dihydrobenzo[1,2-b:4,5-b']dithiophene-4,8-dione (3 g, 13.6 mmol) was added, and the mixture was heated at 50° C. for 1 hour before cooling down to room temperature. Subsequently, a solution of 20 g of $SnCl_2$ in 50 mL 10% aqueous HCl solution was added in a dropwise fashion followed by further heating at 60° C. for 1 hour. After the reaction, brine (30 mL) was added. The organic phase was separated and evaporated under vacuum. The residue was diluted with MeOH (100 mL) and filtered. The solid was washed with MeOH several times. The brown solid was purified by column chromatography with $CHCl_3$:hexane 5:6 as eluent. Recrystallization of the crude product collected from flash chromatography from hexane gave 4.03 g (57% yield) of a pale yellow crystal after drying in vacuo. $^1$H NMR ($CDCl_3$, 500 MHz), δ=7.59 (d, J=5.5 Hz, 2H), 7.51 (d, J=6.0 Hz, 2H), 2.65 (t, J=6.5 Hz, 4H), 1.70-1.80 (m, 4H), 1.56-1.65 (m, 4H), 1.22-1.47 (m, 24H), 0.90 (t, J=6.5 Hz, 6H).

Step 2: Preparation of 4,8-didodecylbenzo[1,2-b:4,5-b']dithiophene. To a solution of 4,8-didodecynbenzo[1,2-b:4,5-b']dithiophene (1.04 g, 2 mmol) in THF (33 mL) in a round-bottomed flask was added 10% Pd/C (0.21 g, 0.2 mmol). The mixture was stirred under a hydrogen atmosphere at room temperature for 24 h. After filtration the solvent was removed by vacuum evaporation, and the residue was passed through a silica gel flash column with hexane as eluent to give a white solid (530 mg, yield 50%). 1H NMR ($CDCl_3$, 500 MHz) δ=7.48 (d, J=5.5 Hz, 2H), 7.47 (d, J=5.5 Hz, 2H), 3.19 (t, J=7.5 Hz, 4H), 1.76-1.89 (m, 4H), 1.42-1.53 (m, 4H), 1.19-1.42 (bs, 32H), 0.90 (t, J=7.0 Hz, 6H).

Step 3: Preparation of 4,8-didodecyl-2,6-Bis-trimethylstannylbenzo[1, 2-1):4,5-b']dithiophene. To a solution of 4,8-didodecylbenzo[1,2-b:4,5-b']dithiophene (553 mg, 1.05 mmol) in dry tetrahydrofuran (16 mL) was added n-butyllithium (2.5 M in hexane, 0.92 mL, 2.31 mmol) at −78° C. After 1 hour, trimethyltin chloride (488 mg, 2.45 mmol) was added in one portion. The mixture was stirred at room temperature for 2 hours, poured into water and extracted with ether three times. The organic layer was washed with brine and dried over anhydrous $MgSO_4$. Upon evaporating the solvent, a pale yellow oil was obtained which is recrystallized from EtOH to give a white solid (524 mg, yield 58%). 1H NMR ($CDCl_3$, 500 MHz) δ=7.51 (s, 2H), 3.22 (t, J=8.0 Hz, 4H), 1.76-1.91 (m, 4H), 1.36-1.42 (m, 4H), 1.22-1.42 (bs, 32H), 0.91 (t, J=7.0 Hz, 6H), 0.47 (s, 18 H). See also, *Chem. Mater.* 2006, 18, 3237.

Example 1b

Preparation of 4,8-dioctyl-2,6-bis-trimethylstannylbenzo[1,2-b:4,5-b']dithiophene

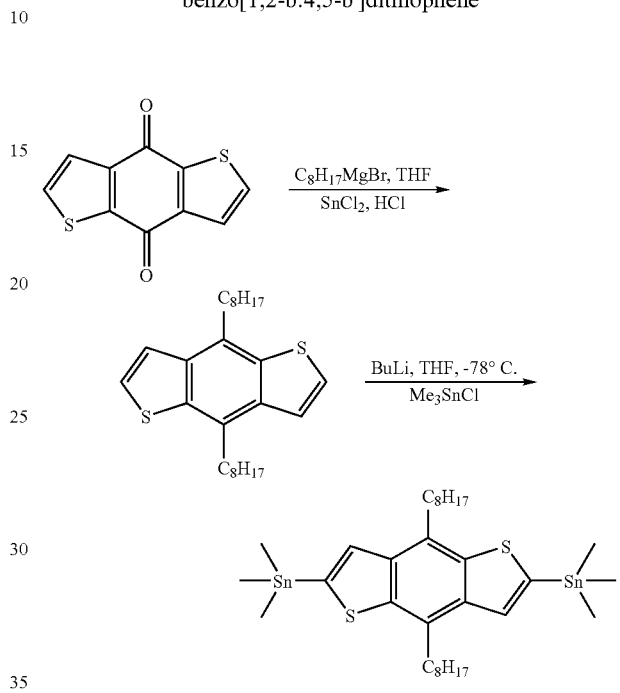

Step 1: Preparation of 4,8-dioctylbenzo[1,2-b:4,5-b']dithiophene. To a 100 mL flask under nitrogen was added 4,8-dihydrobenzo[1,2-b:4,5-b']dithiophene-4,8-dione (1.1 g, 5.0 mmol) and anhydrous THF (10 mL). The mixture was heated to reflux and octylmagnesium bromide (20 mmol, 10 mL, 2.0 M in $Et_2O$) was added dropwise. After refluxing for 2 hours more, $SnCl_2$ solution (7.3 g in 19 mL 10% HCl) was slowly added dropwise. The mixture was kept at 60° C. for 1 hour. After cooling down, the organic phase was separated. The water phase was extracted with ether once and the organic phases were combined and dried over $Na_2SO_4$. Purification by column chromatography with hexane as eluent gave a yellow oil (780 mg, yield 37.6%). 1H NMR ($CDCl_3$, 500 MHz) δ=7.48 (d, J=5.5 Hz, 2H), 7.47 (d, J=5.5 Hz, 2H), 3.20 (t, J=7.5 Hz, 4H), 1.75-1.88 (m, 4H), 1.43-1.54 (m, 4H), 1.21-1.42 (bs, 16H), 0.90 (t, J=7.0 Hz, 6H).

Step 2: Preparation of 4,8-dioctyl-2,6-bis-trimethylstannylbenzo[1,2-b:4,5-b']dithiophene. To a solution of 4,8-dioctylbenzo[1,2-b:4,5-b']dithiophene (782 mg, 1.89 mmol) in dry tetrahydrofuran (36 mL) was added n-butyllithium (2.5 M in hexane, 1.66 mL, 4.15 mmol) at −78° C. After 1 hour, trimethyltin chloride (877 mg, 4.40 mmol) was added in one portion. The mixture was stirred at room temperature for 2 hours, poured into water and extracted with ether three times. The organic layer was washed with brine and dried over anhydrous $MgSO_4$. Upon evaporating the solvent, a pale yellow oil was obtained (1.03 g, yield 74%). Upon standing for one week, yellow crystals emerged and were collected (413 mg, yield 29%). 1H NMR ($CDCl_3$, 500 MHz) δ=7.51 (s, 2H), 3.22 (t, J=8.0 Hz, 4H), 1.76-1.89 (m, 4H), 1.45-1.54 (m, 4H), 1.22-1.45 (bs, 16H), 0.90 (t, J=7.0 Hz, 6H), 0.47 (s, 18H).

Example 1c

Preparation of 4,8-bis(2-ethylhexyl)-2,6-bis-trimethylstannylbenzo[1,2-b:4,5-b']dithiophene

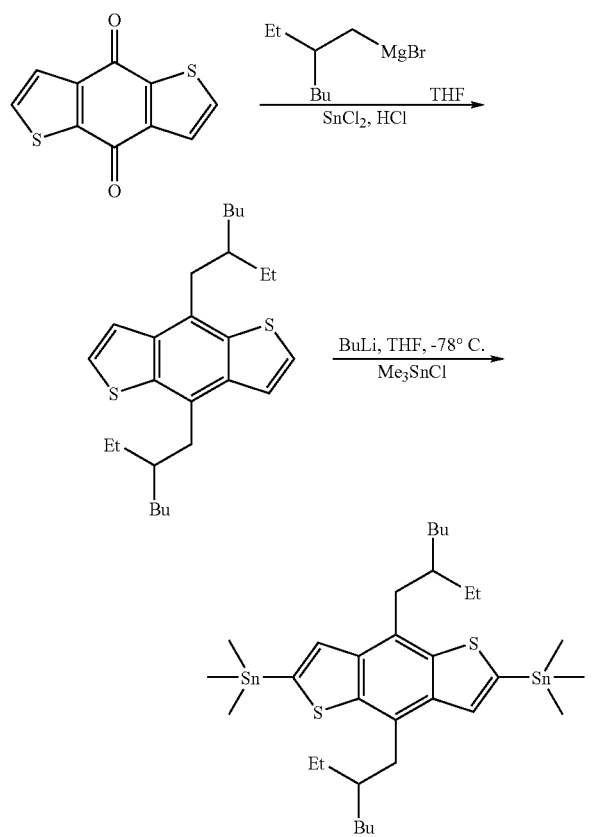

Step 1: Preparation of 4,8-bis(2-ethylhexyl)benzo[1,2-b:4, 5-b']dithiophene. To a 100 mL flask under nitrogen was added magnesium (656 mg, 27 mmol) and anhydrous THF (10 mL). The mixture was heated under reflux and 2-ethylhexyl bromide (5.6 mL, 30 mmol) was added dropwise. The reaction mixture was kept at refluxing temperatures until all magnesium was consumed. After cooling down, 4,8-dihydrobenzo[1,2-b:4,5-b']dithiophene-4,8-dione (1.1 g, 5.0 mmol) was added in one portion. After refluxing for 1 hour more, it was cooled down again to room temperature. $SnCl_2$ solution (7.5 g in 19 mL 10% HCl) was slowly added dropwise and then the mixture was kept at 60° C. for 1 hour. After cooling down, brine (11 mL) was added. The organic phase was separated and dried over $Na_2SO_4$. The residue after vacuum evaporation was purified by column chromatography with hexane as eluent and gave a pale yellow oil (910 mg, yield 43%). 1H NMR (CDCl$_3$, 500 MHz) δ=7.47 (d, J=6.0 Hz, 2H), 7.45 (d, J=6.0 Hz, 2H), 3.08-3.20 (m, 4H), 1.92-2.04 (m, 2H), 1.13-1.49 (m, 16H), 0.91 (t, J=7.0 Hz, 6H), 0.85 (t, J=7.0 Hz, 6H).

Step 2: Preparation of 4,8-bis(2-ethylhexyl)-2,6-bis-trimethlstannylbenzo[1,2-b:4,5-b']dithiophene. To a solution of 4,8-bis(2-ethylhexyl)benzo[1,2-b:4,5-b']dithiophene (237 mg, 0.57 mmol) in dry tetrahydrofuran (11 mL) was added n-butyllithium (2.5 M in hexane, 0.5 mL, 1.25 mmol) at −78° C. After 1 hour, trimethyltin chloride (264 mg, 1.32 mmol) was added in one portion. The mixture was stirred at room temperature for 2 hours, poured into water (20 mL) and extracted with ether three times. The organic layer was washed with brine and dried over anhydrous MgSO$_4$. Upon evaporating the solvent, a pale yellow oil was obtained (437 mg, yield 100%). Upon standing in a freezer for 2 days, pale yellow crystals emerged and were collected (326 mg, yield 77%). 1H NMR (CDCl$_3$, 500 MHz) δ=7.51 (s, 2H), 3.07-3.23 (m, 4H), 1.96-2.07 (m, 2H), 1.21-1.50 (m, 16H), 0.94 (t, J=7.0 Hz, 6H), 0.89 (t, J=7.0 Hz, 6H), 0.46 (s, 18H).

Example 1d

Preparation of 4,8-bis(10-phenyldecyl)-2,6-bis-trimethylstannylbenzo[1,2-b:4,5-b']dithiophene

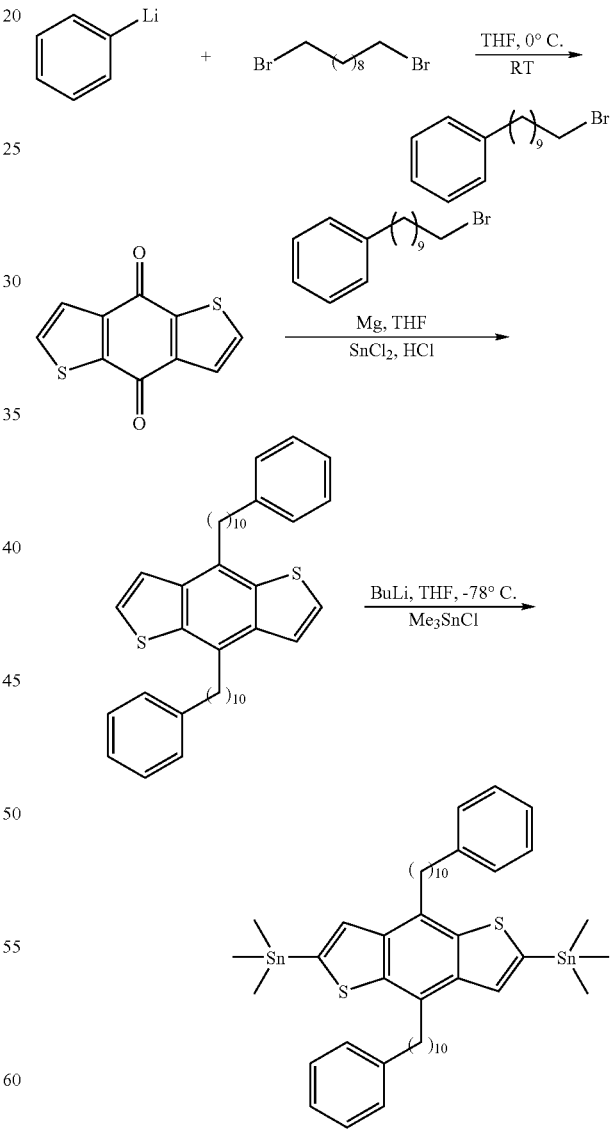

Step 1: Preparation of 10-bromodecylbenzene. To a 250 mL flask in ice-water bath was added 1,10-dibromodecane (46.0 g, 153 mmol) and anhydrous THF (100 ml) under nitrogen. Phenyl lithium (1.8 M in dibutyl ether, 28.5 mL, 51 mmol) was added dropwise. After addition was completed, the reaction mixture was stirred for 1 hour and warmed to room temperature. After 48 hours, it was quenched with H₂O (200 mL), extracted with CH₂Cl₂ (200 mL×2) and dried. After concentration, the residue was distilled to give a colorless oil (9.35 g, yield 61.7%) at 130° C./0.07 mmHg. $^1$H NMR (CDCl₃, 500 MHz) δ=7.27-7.32 (m, 2H), 7.20 (d, J=6.5 Hz, 3H), 3.43 (t, J=7.0 Hz, 2H), 2.62 (t, J=8.0 Hz, 2H), 1.84-1.96 (m, 2H), 1.60-1.68 (m, 2H), 1.41-1.52 (m, 2H), 1.24-1.41 (m, 10H).

Step 2: Preparation of 4,8-bis(10-phenyldecyl)benzo[1,2-b:4,5-b']dithiophene. To a 100 mL flask under nitrogen was added magnesium (486 mg, 20 mmol) and anhydrous THF (10 mL). The mixture was heated under reflux and 10-bromodecylbenzene (5.95 g, 20 mmol) was added dropwise. The reaction mixture was kept under reflex temperatures until all magnesium was consumed. Subsequently, 4,8-dihydrobenzo[1,2-b:4,5-b']dithiophene-4,8-dione (1.1 g, 5.0 mmol) suspended in anhydrous THF (10 ml) was added dropwise. After refluxing for 3 hours more, it was cooled down to room temperature. SnCl₂ solution (7.5 g in 19 mL 10% HCl) was slowly added dropwise and then the mixture was kept at 60° C. overnight. After cooling down, brine (25 mL) was added. The organic phase was separated and dried over Na₂SO₄. The residue after vacuum evaporation was purified by column chromatography with hexane/AcOEt 50:1 as eluent and gave a pale yellow oil (466 mg, yield 15%), which turned into a solid upon standing for a few days. $^1$H NMR (CDCl₃, 500 MHz) δ=7.48 (d, J=6.0 Hz, 2H), 7.46 (d, J=5.0 Hz, 2H), 7.27-7.32 (m, 4H), 7.19 (d, J=7.0 Hz, 6H), 3.19 (t, J=8.0 Hz, 4H), 2.61 (t, J=7.5 Hz, 4H), 1.75-1.86 (m, 4H), 1.58-1.67 (m, 4H), 1.42-1.51 (m, 4H), 1.15-1.41 (m, 20H).

Step 3: Preparation of 4,8-bis(10-phenyldecyl)-2,6-bis-trimethylstannylbenzo[1,2-b:4,5-b']dithiophene. To a solution of 4,8-bis(10-phenyldecyl)benzo[1,2-b:4,5-b']dithiophene (466 mg, 0.75 mmol) in dry tetrahydrofuran (15 mL) was added n-butyllithium (2.5 M in hexane, 0.66 mL, 1.65 mmol) at −78° C. After 1 hour, trimethyltin chloride (349 mg, 1.75 mmol) was added in one portion. The mixture was stirred at room temperature overnight, poured into water (25 mL) and extracted with ether three times. The organic layer was washed with brine and dried over anhydrous MgSO₄. Upon evaporating the solvent, a pale yellow oil was obtained (500 mg, yield 70%). $^1$H NMR (CDCl₃, 500 MHz) δ=7.49 (s, 2H), 7.27-7.32 (m, 4H), 7.17 (d, J=7.5 Hz, 6H), 3.19 (t, J=7.5 Hz, 4H), 2.59 (t, J=8.0 Hz, 4H), 1.75-1.84 (m, 4H), 1.56-1.66 (m, 4H), 1.42-1.50 (m, 4H), 1.17-1.41 (m, 20H), 0.45 (s, 18H).

Example 1e

Preparation of 4,7-bis(5-bromo-4-dodecylthiophen-2-yl)-2,1,3-benzothiadiazole

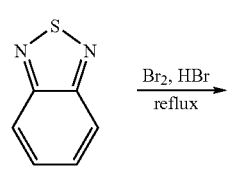

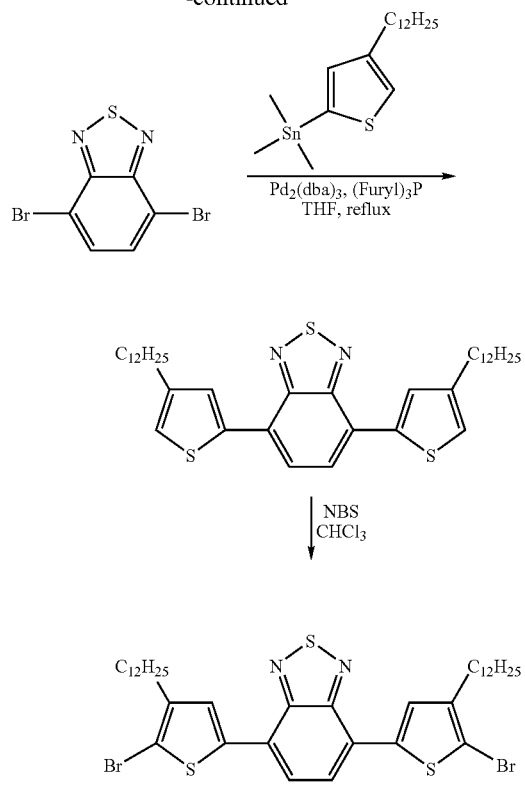

Step 1: Preparation of 4,7-dibromo-2,1,3-benzothiadiazole. To a solution of benzothiadiazole (10 g, 73.44 mmol) in 150 mL of HBr (48%) was added dropwise a solution of Br₂ (35.21 g, 220.32 mmol) in 100 mL of HBr (48%) very slowly. After refluxing for 6 hours, an orange solid precipitated. The mixture was allowed to cool to room temperature, and a saturated solution of NaHSO₃ was added to neutralize the residual amount of Br₂. The mixture was filtered and washed exhaustively with water. The solid was then washed once with cold diethyl ether and purified by flash chromatography with CHCl₃ as eluent to give a pale yellow solid (18.4 g, yield 85%). $^1$H NMR (CDCl₃, 500 MHz), δ=7.73 (s, 2H).

Step 2: Preparation of 4,7-bis(4-dodecylthiophen-2-yl)-2,1,3-benzothiadiazole. To a 100 mL round bottom flask under nitrogen, 4,7-dibromo-2,1,3-benzothiadiazole (1.18 g, 4.0 mmol), 2-trimethylstannyl-4-dodecylthiophene (4.03 g, 9.7 mmol, prepared according to *Macromolecules* 2002, 35, 6883), Pd₂(dba)₃ (146.5 mg, 0.16 mmol), tri(2-furyl)phosphine (148.6 mg, 0.64 mmol) and anhydrous THF (30 mL) were added. The mixture was heated under reflux for 20 hours and allowed to cool down. The solvent was removed by rotary evaporator and the residue was purified by column chromatography with CHCl₃:hexane 1:3 as eluent to give an orange solid (2.0 g, yield 78%). $^1$H NMR (CDCl₃, 500 MHz), δ=8.00 (s, 2H), 7.85 (s, 2H), 7.06 (s, 2H), 2.71 (t, J=7.5 Hz, 4H), 1.68-1.76 (m, 4H), 1.19-1.47 (m, 36H), 0.90 (t, J=6.8 Hz, 6H).

Step 3: Preparation of 4,7-bis(5-bromo-4-dodecylthiophen-2-yl)-2,1,3-benzothiadiazole. To a 50 mL round bottom flask wrapped with aluminum foil under nitrogen, 4,7-bis(4-dodecylthiophen-2-yl)-2,1,3-benzothiadiazole (637 mg, 1.0 mmol), NBS (392 mg, 2.2 mmol) and CHCl₃ (13 mL) were added. The mixture was stirred overnight and the solvent was removed by rotary evaporator. The residue was purified by column chromatography with CHCl₃:hexane 1:50 as eluent to give a red solid (520 mg, yield 65%). ¹H NMR (CDCl₃, 500 MHz), δ=7.78 (s, 2H), 7.76 (s, 2H), 2.65 (t, J=7.8 Hz, 4H), 1.64-1.72 (m, 4H), 1.21-1.47 (m, 36H), 0.89 (t, J=6.8 Hz, 6H).

Example 1f

Preparation of 4,7-bis(5-bromo-4-dodecyl-2-thienyl)-2,1,3-benzothiadiazole

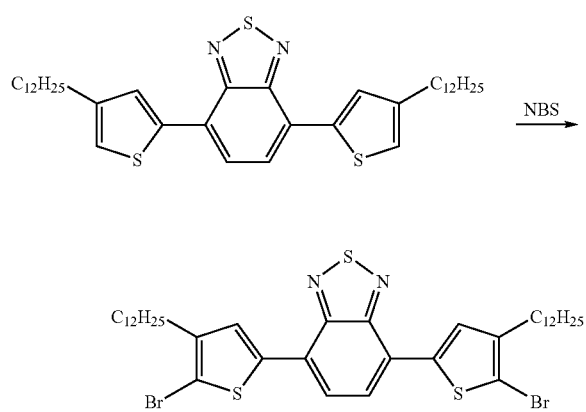

The building block 4,7-bis(4-dodecyl-2-thienyl)-2,1,3-benzothiadiazole was prepared according to literature procedures and dissolved in chloroform (60 mL). Acetic acid (20 mL) and N-bromosuccinimide (0.746 g, 4.19 mmol) were added. The reaction was stirred at room temperature overnight. Water (150 mL) was added and the mixture was extracted with chloroform. The organic layer was separated, washed with an saturated aqueous solution of NaHCO₃, followed by water, and dried over MgSO₄. Solvent was removed under vacuum and the residue was purified by chromatography using a 1:4 mixture of dichloromethane/hexanes as eluent. The yield of the 4,7-bis(5-bromo-4-dodecyl-2-thienyl)-2,1,3-benzothiadiazole was 1.46 g (88%). ¹H NMR (CDCl₃, 500 MHz) δ: 7.77 (s, 2H), 7.76 (s, 2H), 2.64 (t, J=7.8, 4H), 1.67 (m, 4H), 1.40-1.25 (m, 36H), 0.86 (t, J=7.5, 6H).

Example 1g

Preparation of 4,8-bis[(2-hexyldecyl)oxy]-benzo[1,2-b:4,5-b']dithiophene

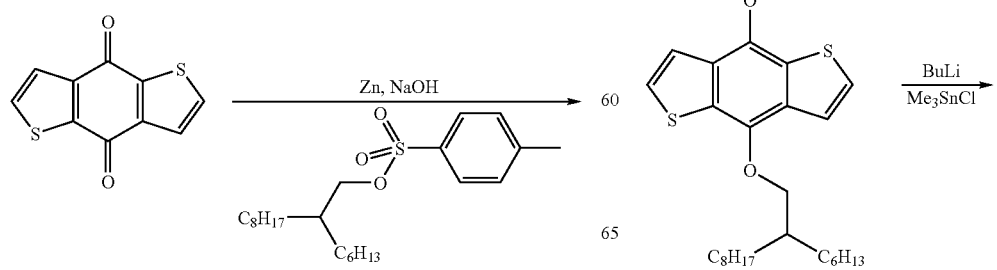

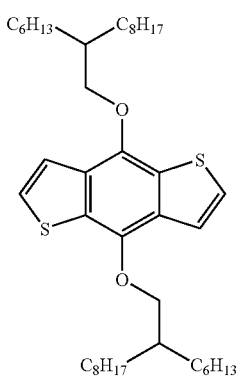

Benzo[1,2-b:4,5-b']dithiophene-4,8-dione (1.0 g, 4.54 mmol) and Zn powder (0.659 g, 10.1 mmol) were suspended in ethanol (10 mL). A solution of NaOH (3 g) in water (15 mL) was added. The resulting mixture was heated to reflux for 1 hour, after which 2-hexyldecyl(4-methylbenzenesulfonate) (3.86 g, 9.73 mmol) was added. The reaction was heated to reflux overnight. The reaction was cooled to room temperature and water (50 mL) was added. The reaction was extracted with ether, followed by separation and drying of the organic layer over MgSO₄. Solvent was removed and the residue was purified by chromatography (10% dichloromethane in hexanes as eluent). The yield of the 4,8-bis[(2-hexyldecyl)oxy]-benzo[1,2-b:4,5-b']dithiophene was 0.80 g (26%). ¹H NMR (CDCl₃, 500 MHz) δ=7.47 (d, J=2.75, 2H), 7.36 (d, J=2.75, 2H), 4.16 (m, 4H), 1.86 (m, 2H), 1.38-1.65 (m, 48H), 0.86 (m, 12H).

Example 1h

Preparation of 4,8-bis[(2-hexyldecyl)oxy]-2,6-bis(1,1,1-trimethyl-stannanyl)benzo[1,2-b:4,5-b']dithiophene

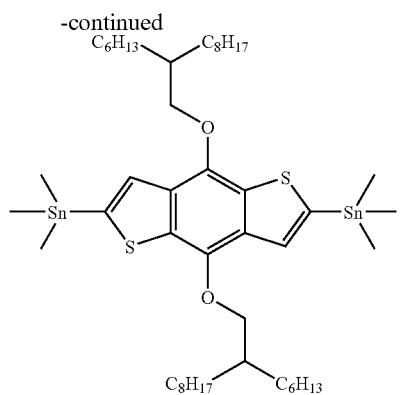

4,8-Bis[(2-hexyldecyl)oxy]-benzo[1,2-b:4,5-b']dithiophene (0.80 g, 1.19 mmol) was dissolved in dry THF (10 mL) under nitrogen. The solution was cooled to −70° C. and butyllithium (1.0 mL, 2.M solution in hexanes, 2.5 mmol) was added dropwise. The reaction was allowed to warm to room temperature over 2 hours and cooled back to −78° C. Trimethyltin chloride (0.61 g, 3.0 mmol) was added. The reaction was allowed to warm to room temperature and stirred under nitrogen overnight. Water (50 mL) was added and the reaction was extracted with ether. Organic layer was separated and dried over $Na_2SO_4$. Solvent was removed under vacuum. To the residue was added ethanol (10 mL) and the suspension was stirred overnight. The resulting white solids were collected by filtration and dried under vacuum to afford the product 4,8-bis[(2-ethylhexyl)oxy]-2,6-bis(1,1,1-trimethyl-stannanyl)benzo[1,2-b:4,5-b']dithiophene (0.58 g, 49%). $^1$H NMR (CDCl$_3$, 500 MHz) δ=7.52 (m, 2H), 4.17 (d, J=5.0 Hz, 4H), 1.86 (m, 2H), 1.67 (m, 4H), 1.28-1.55 (m, 44H), 0.86 (m, 12H), 0.55 (m, 18H).

Example 2

Polymer Synthesis

Example 2a

Preparation of poly[{2,6-bis[(2-hexyldecyl)oxy]benzo[1,2-b:4,5-b']dithiophene)(3-dodecyl-2,5-thiophenediyl)-2,1,3-benzothiadiazole-4,7-diyl(4-dodecyl-2,5-thiophenediyl)}-co-[{2,6-bis[(2-hexyldecyl)oxy]benzo[1,2-b:4,5-b']dithiophene)(2,5-thiophenediyl)-2,1,3-benzothiadiazole-4,7-diyl(2,5-thiophenediyl)}] (x=0.77; y=0.23)

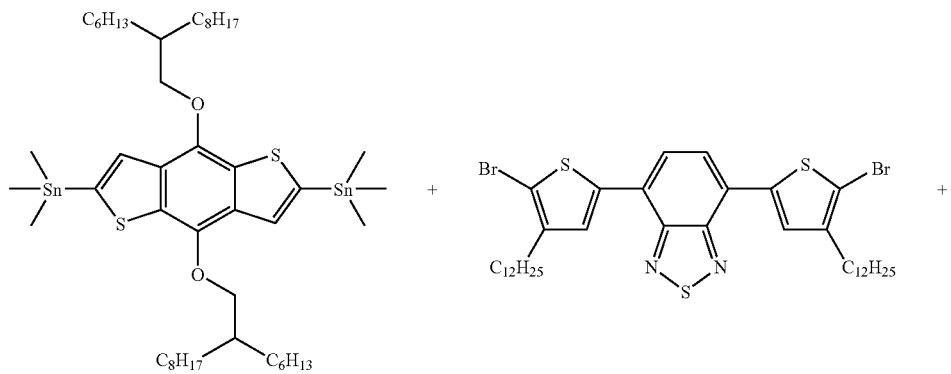

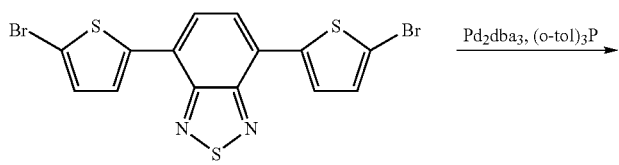

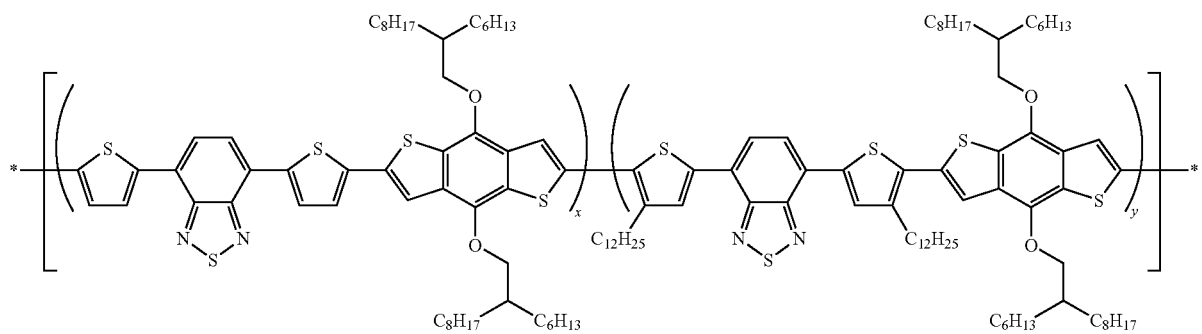

The building block 4,7-bis(5-bromo-2-thienyl)-2,1,3-benzothiadiazole was prepared according to literature procedures (Moule et al., *Chem. Mater.*, 2008, 20: 4045-4050). To a Schlenk flask were added 4,7-bis(5-bromo-2-thienyl)-2,1,3-benzothiadiazole (46.23 mg, 0.101 mmol), 4,8-bis[(2-hexyldecyl)oxy]-2,6-bis(1,1,1-trimethyl-stannanyl)benzo[1,2-b:4,5-b']dithiophene (141.65 mg, 0.135 mmol), 4,7-bis(5-bromo-4-dodecyl-2-thienyl)-2,1,3-benzothiadiazole (24.6 mg, 0.0309 mmol), $Pa_2 dba_3$ (4.93 mg, 0.00538 mmol), and $P(o-tol)_3$ (13.10 mg, 0.431 mmol). The flask was degassed and backfilled with nitrogen three times. Dry chlorobenzene (20 mL) was injected and the reaction was heated to 130° C. for 18 hours. The reaction was cooled to room temperature and the content of the flask was poured into methanol (100 mL). The precipitates were collected by filtration and the solids were extracted with acetone for 1 hour, dichloromethane for 3 hours and chloroform for three hours. Finally the polymer was extracted with chlorobenzene. The chloroform solution was poured into methanol, and the precipitates were again collected by filtration, dried under vacuum to afford the title polymer (40 mg).

Example 2b

Preparation of poly[{2,6-bis[(2-hexyldecyl)oxy]benzo[1,2-b:4,5-b']dithiophene)(3-dodecyl-2,5-thiophenediyl)-2,1,3-benzothiadiazole-4,7-diyl(4-dodecyl-2,5-thiophenediyl)}-co-[{2,6-bis[(2-hexyldecyl)oxy]benzo[1,2-b:4,5-b']dithiophene)(2,5-thiophenediyl)-2,1,3-benzothiadiazole-4,7-diyl(2,5-thiophenediyl)}] (x=0.71; y=0.29)

To a Schlenk flask were added 4,8-bis[(2-hexyldecyl)oxy]-2,6-bis(1,1,1-trimethyl-stannanyl)benzo[1,2-b:4,5-b']dithiophene (129.74 mg, 0.123 mmol), 4,7-bis(5-bromo-2-thienyl)-2,1,3-benzothiadiazole (39.53 mg, 0.0863 mmol), 4,7-bis(5-bromo-4-dodecyl-2-thienyl)-2,1,3-benzothiadiazole (27.43 mg, 0.345 mmol), $Pa_2 dba_3$ (4.513 mg, 0.000493 mmol), and $P(o-tol)_3$ (12.00 mg, 0.394 mmol). The flask was degassed and backfilled with nitrogen three times. Dry chlorobenzene (20 mL) was injected and the reaction was heated to 130° C. for 18 hours. The reaction was cooled to room temperature and the content of the flask was poured into methanol (200 mL). The precipitates were collected by filtration and the solids were extracted with ethyl acetate for 5 hours, and THF for 5 hours. Finally the polymer was extracted with chlorobenzene. The chloroform solution was poured into methanol, and the precipitates were again collected by filtration, dried under vacuum to afford the title polymer (64 mg, 49% yield).

Example 2c

Preparation of poly[{2,6-bis[(2-hexyldecyl)oxy]benzo[1,2-b:4,5-b']dithiophene)(3-dodecyl-2,5-thiophenediyl)-2,1,3-benzothiadiazole-4,7-diyl(4-dodecyl-2,5-thiophenediyl)}-co-[{2,6-bis[(2-hexyldecyl)oxy]benzo[1,2-b:4,5-b']dithiophene)(2,5-thiophenediyl)-2,1,3-benzothiadiazole-4,7-diyl(2,5-thiophenediyl)}] (x=0.62; y=0.38)

To a Schlenk flask were added 4,8-bis[(2-hexyldecyl)oxy]-2,6-bis(1,1,1-trimethyl-stannanyl)benzo[1,2-b:4,5-b']dithiophene (117.27 mg, 0.111 mmol), 4,7-bis(5-bromo-2-thienyl)-2,1,3-benzothiadiazole (30.62 mg, 0.0668 mmol), 4,7-bis(5-bromo-4-dodecyl-2-thienyl)-2,1,3-benzothiadiazole (33.64 mg, 0.0423 mmol), $Pa_2 dba_3$ (4.08 mg, 0.0045 mmol), and $P(o-tol)_3$ (10.85 mg, 0.0356 mmol). The flask was degassed and backfilled with nitrogen three times. Dry chlorobenzene (20 mL) was injected and the reaction was heated to 130° C. for 18 hours. The reaction was cooled to room temperature and the content of the flask was poured into methanol (100 mL). The precipitates were collected by filtration and the solids were extracted with methanol for 8 hours, ethyl acetate for 5 hours, and then dichloromethane for 15 hours. Finally the polymer was extracted into chloroform. The chloroform solution was poured into methanol, and the precipitates were again collected by filtration, dried under vacuum to afford the title polymer 88 mg (72% yield).

Example 2d

Preparation of poly[{2,6-bis[(2-hexyldecyl)oxy]benzo[1,2-b:4,5-b']dithiophene)(3-dodecyl-2,5-thiophenediyl)-2,1,3-benzothiadiazole-4,7-diyl(4-dodecyl-2,5-thiophenediyl)}-co-[{2,6-bis[(2-hexyldecyl)oxy]benzo[1,2-b:4,5-b']dithiophene)(2,5-thiophenediyl)-2,1,3-benzothiadiazole-4,7-diyl(2,5-thiophenediyl)}] (x=0.5; y=0.5)

To a Schlenk flask were added 4,8-bis[(2-hexyldecyl)oxy]-2,6-bis(1,1,1-trimethyl-stannanyl)benzo[1,2-b:4,5-b']dithiophene (600 mg, 0.60 mmol), 4,7-bis(5-bromo-2-thienyl)-2,1,3-benzothiadiazole (137.9 mg, 0.301 mmol), 4,7-bis(5-bromo-4-dodecyl-2-thienyl)-2,1,3-benzothiadiazole (229.60 mg, 0.289 mmol), $Pa_2 dba_3$ (22.05 mg, 0.024 mmol), and $P(o-tol)_3$ (58.63 mg, 0.193 mmol). The flask was degassed and backfilled with argon three times. Dry chlorobenzene (90 mL) was injected and the reaction was heated to 130° C. for 18 hours. The reaction was cooled to room temperature and the content of the flask was poured into methanol (200 mL). The precipitates were collected by filtration and the solids were extracted with methanol for 5 hours, ethyl acetate for 5 hours, hexanes for 15 hours, and then dichloromethane for 5 hours. Finally the polymer was extracted into chloroform. The chloroform solution was poured into methanol, and the precipitates were again collected by filtration, dried under vacuum to afford the title polymer 511 mg (75% yield).

Example 3

Characterization of Polymers

Example 3a

Optical Properties

Optical absorption measurements of polymers from Example 2 were carried out using a Cary UV-vis spectrometer on chloroform solution of the polymer. The onset of the absorption is used to estimate the polymer bandgap.

Example 3b

Electronic Properties

Cyclic voltammetry measurements of polymers from Example 2 were carried out under nitrogen atmosphere using a BAS-CV-50W voltammetric analyzer with 0.1 M tetra-n-butylammonium hexafluorophosphate in actonitrile as the supporting electrolyte. A platinum disk working electrode, a platinum wire counter electrode and a silver wire reference electrode were employed and $Fc/Fc^+$ was used as reference for all measurements. The scan rate was 50 mV/S. Polymer films were produced by drop casting from 0.2% (w/w) toluene solutions. The supporting electrolyte solution was thoroughly purged with $N_2$ before all CV measurements.

Using data from the cyclic voltammograms, the HOMO of a representative copolymer from Example 2 was calculated from the equation 4.44−1.06=−5.50; and the LUMO was calculated from the equation −4.44+1.07=−3.37.

Example 4

Device Fabrication

Example 4a

Thin Film Transistor Fabrication and Measurements

Charge carrier mobilities of the polymers were determined using organic field effect transistors. Bottom-gate TFTs were fabricated on $Si/SiO_2$ substrates, the surface of which was modified with a monolayer of OTS before semiconductor deposition. Semiconductors were spun from pristine polymer solution (10 mg/ml in dichlorobenzene by volume) onto these substrates and the films were dried in a vacuum oven overnight. Au top-contacts (30 nm) were thermally evaporated through metal stencils onto these films at a vacuum of $\sim 1 \times 10^{-6}$ ton to complete the device. The channel dimensions of the devices are about 25 μm (length) and about 500 μm (width). The capacitance of the dielectric is 10 $nF/cm^2$. The devices were characterized in air and in an electrically shielded environment (Signatone dark box). Three Signatone probes were used to access the electrodes, and the signals were triaxially-shielded from very near the probe tip to a Keithley 4200 semiconductor characterization (3 independent SMUs each equipped with a remote preamplifier). FET metrics (mobility, threshold voltage, and on/off ratio) were extracted from transfer and output plots according to standard transistor equations.

Figure 2:
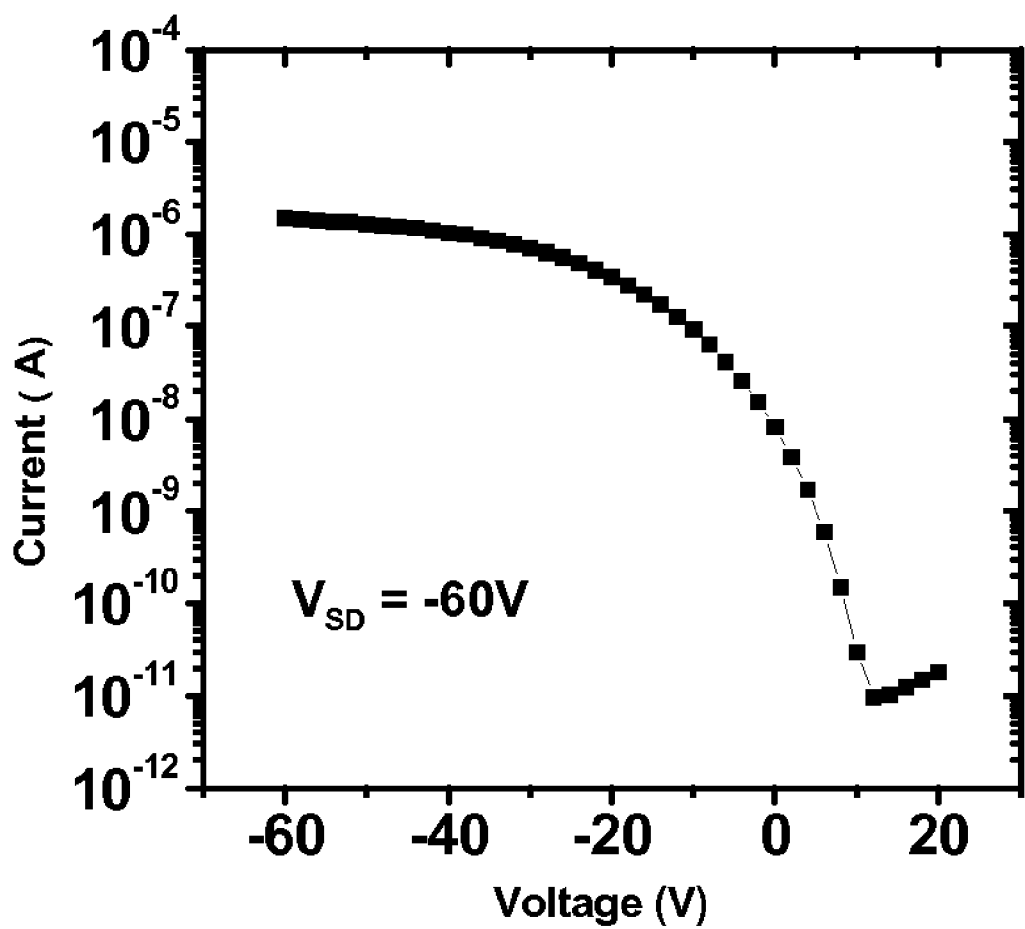
FIG. 2 shows the transfer plot of a bottom-gate thin film transistor device having an active layer incorporating a representative co-polymer of the present teachings, where the $V_{sd}$ is −60V.

FIG. 2 shows a representative transfer plot of a bottom-gate TFT using a polymer from Example 2 as the active layer. The extracted hole mobility is about $8.2 \times 10^{-3}$ $cm^2/Vs$, and the current on/off ratio is about $1.5 \times 10^5$.

Example 4b

Photovoltaic Cell Fabrication and Measurements

Photovoltaic devices incorporating the copolymers described in Example 2 were fabricated and characterized. Devices with both thin (~100 nm) and thick (~250 nm) active layer were built. Before device fabrication, the patterned ITO-coated glass substrates were cleaned by ultrasonic treatment in detergent, de-ionized water, acetone, and isopropyl alcohol sequentially, followed by UV-ozone treatment for 40 minutes. A PEDOT:PSS layer of about 40 nm thickness was spin-coated from an aqueous solution (HC Stark, Baytron AI 4083) onto ITO coated glass substrates, followed by baking at 150° C. for 30 minutes in air. The polymer/fullerene mixture solutions in 1,2-dichlorobenzene were prepared at the following ratios: polymer:$C_{60}$PCBM 12:24 mg/ml and polymer:$C_{70}$PCBM 12:18 mg/ml. The mixture solutions were then stirred for at least 1 hour at 120° C. in a glove box and were cooled down to ~60° C. before spin-coating on top of the PEDOT:PSS layer. To complete the device fabrication, a layer of lithium fluoride (LiF) having a thickness of about 0.6 nm and an aluminum layer of about 100 nm thickness were successively deposited thermally under vacuum of $\sim 10^{-6}$ Torr. The active area of the device was about 0.093 $cm^2$. The devices were then encapsulated with a cover glass using EPO-TEK OG112-6 UV curable epoxy (Epoxy Technology) in the glove box.

The photovoltaic characteristics of the encapsulated devices were tested in air. The current density-voltage (J-V) curves were obtained using a Keithley 2400 source-measure unit. The photocurrent was measured under simulated AM1.5G irradiation (100 mW $cm^{-2}$) using a xenon-lamp-based solar simulator (Newport 91160A 300 W Class-A Solar Simulator, 2 inch by 2 inch uniform beam) with air mass 1.5 global filter. The light intensity was set using a NREL calibrated silicon photodiode with a color filter. External quantum efficiency was measured using Newport's QE setup. Incident light from a xenon lamp (300 W) passing through a monochromator (Newport, Cornerstone 260) was focused on the active area of the cell. The output current was measured using a current pre-amplifier (Newport, 70710QE) and a lock-in amplifier (Newport, 70105 dual channel Merlin). A calibrated silicon diode (Newport 70356) was used as a reference.

Figure 3:
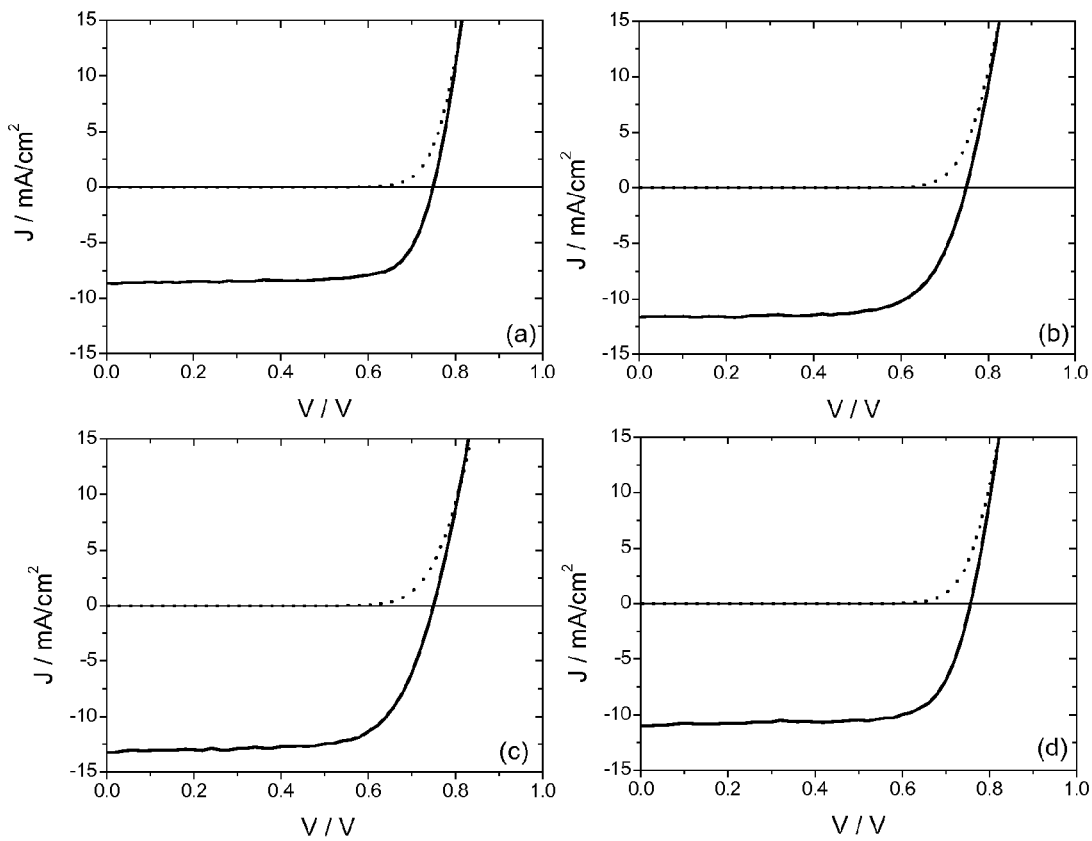
FIG. 3 shows representative current density-voltage plots of certain photovoltaic devices having a blend heterojunction layer as follows (a) a thin (~100 nm) active layer prepared from a mixture of a co-polymer of the present teachings and $C_{60}$PCBM, (b) a thick (~250 nm) active layer prepared from a mixture of a co-polymer of the present teachings and $C_{60}$PCBM, (c) a thin (~100 nm) active layer prepared from a mixture of a co-polymer of the present teachings and $C_{70}$PCBM, (d) a thick (~250 nm) active layer prepared from a mixture of a co-polymer of the present teachings and $C_{70}$PCBM.
Figure 4:
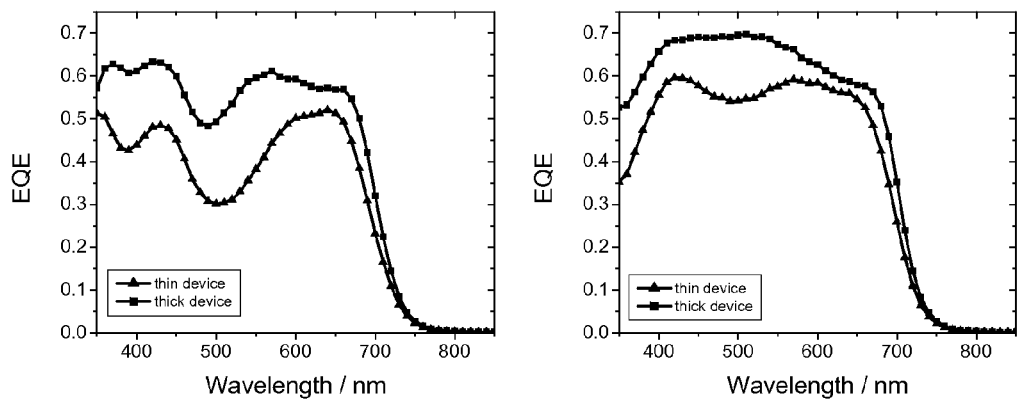
FIG. 4 shows representative EQE-spectra of the four types of devices described in FIG. 3: (left) devices incorporating $C_{60}$PCBM as acceptor, (right) devices incorporating $C_{70}$PCBM as acceptor.

Typical JV characteristics are shown in FIG. 3. The device efficiencies were corrected for mismatch between the solar simulator and the AM1.5G using the EQE spectra shown in FIG. 4. A summary of the device characteristics is given in Table 2 below.

TABLE 2

Device characteristics for random copolymer-based OPV devices.

| | $V_{oc}$ (V) | $J_{sc}$ (mA/cm$^2$) | FF (%) | PCE (%) |
|---|---|---|---|---|
| Polymer:$C_{60}$PCBM thin | 0.74 | 8.85 | 75.9 | 4.97 |
| Polymer:$C_{60}$PCBM thick | 0.74 | 11.76 | 71.3 | 6.20 |
| Polymer:$C_{70}$PCBM thin | 0.76 | 11.23 | 72.7 | 6.20 |
| Polymer:$C_{70}$PCBM thick | 0.74 | 13.19 | 70.3 | 6.86 |

Comparative Examples

Comparative Example 1

Preparation of poly[{2,6-(4,8-dioctylbenzo[1,2-b:4,5-b']dithiophene)}-alt-{5,5-(4,7-bis(4'-dodecylthien-2'-yl)-2,1,3-benzothiadiazole)}](SL15)

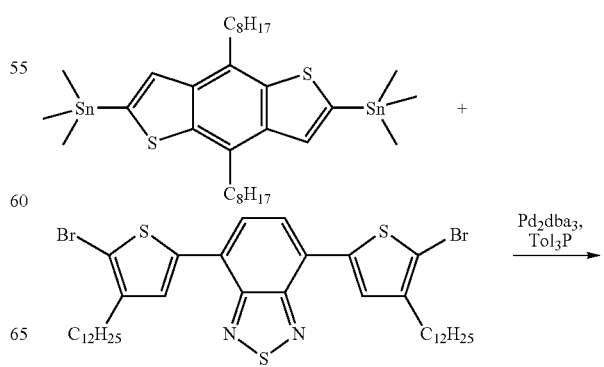

-continued

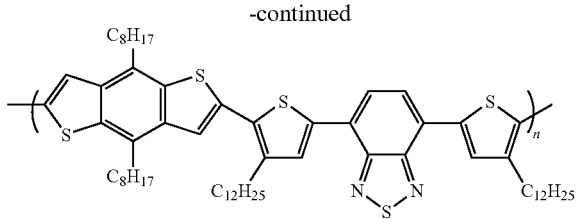

To a 100 ml, storage vessel, 4,8-bis(2-ethylhexyl)-2,6-bis-trimethylstannyl benzo[1,2-b:4,5-b']dithiophene (55.5 mg, 75 μmol), 4,7-bis(5-bromo-4-dodecylthiophen-2-yl)-2,1,3-benzothiadiazole (59.6 mg, 75 μmol), $Pd_2(dba)_3$ (2.7 mg, 4 mol %) and tri(o-tolyl)phosphine (3.7 mg, 16 mol %) were added and mixed in anhydrous chlorobenzene (10 mL) under argon and stirred at 133° C. for 72 hours. After cooling to room temperature, the reaction mixture was poured into MeOH (50 mL), filtered and dried under vacuum oven to give a black solid (78.5 mg, crude yield 100%). Elemental Analysis: Calcd. C, 73.37; H, 8.66; N, 2.67. Found: C, 72.25; H, 8.09; N, 2.97.

Comparative Example 2

Fabrication of an OPV device based on SL15

Photovoltaic devices were fabricated incorporating SL15 and bucky ball compounds such as PCBM. Before device fabrication, patterned ITO-coated glass substrates were cleaned by ultrasonic treatment in detergent, de-ionized water, acetone, isopropyl alcohol sequentially, and UV-ozone treatment for 15 minutes. A PEDOT:PSS layer of about 40 nm thickness was spin-coated from an aqueous solution onto ITO-coated glass substrates, followed by baking at 150° C. for 30 minutes in the air. The polymer/PCBM mixture solution in chlorinated solvents (such as chloroform) was prepared at a concentration of 5:10 mg/ml. The solution was then stirred for ~2 hours at 40° C. in a glove box and was spin-coated on top of the PEDOT:PSS layer. The thickness of active layer was about 100-300 nm. To complete the device fabrication, a thin layer of lithium fluoride (LiF) and 100 nm thickness of aluminum were successively deposited thermally under vacuum of $\sim 10^{-6}$ Torr. The active area of the device was about 0.088 $cm^2$. The devices were then encapsulated with a cover glass using a UV curable epoxy in the glove box.

Such devices using SL15 exhibit much poorer performance than devices based on polymers according to the present teachings, i.e., the polymers of formulae I, II, III, IV, and V. Specifically, devices using SL15 demonstrated an average power conversion efficiency ~2.2%, and a fill factor ~43%, both of which are significantly lower than the values reported in Example 4b in connection with the polymers according to the present teachings.

The present teachings encompass embodiments in other specific forms without departing from the spirit or essential characteristics thereof. The foregoing embodiments are therefore to be considered in all respects illustrative rather than limiting on the present teachings described herein. Scope of the present invention is thus indicated by the appended claims rather than by the foregoing description, and all changes that come within the meaning and range of equivalency of the claims are intended to be embraced therein.

The invention claimed is:

1. An electronic, optical or optoelectronic device comprising:
a first electrode,
a second electrode, and
a semiconductor component disposed between the first electrode and the second electrode, the semiconductor component comprising a copolymer having a formula selected from:

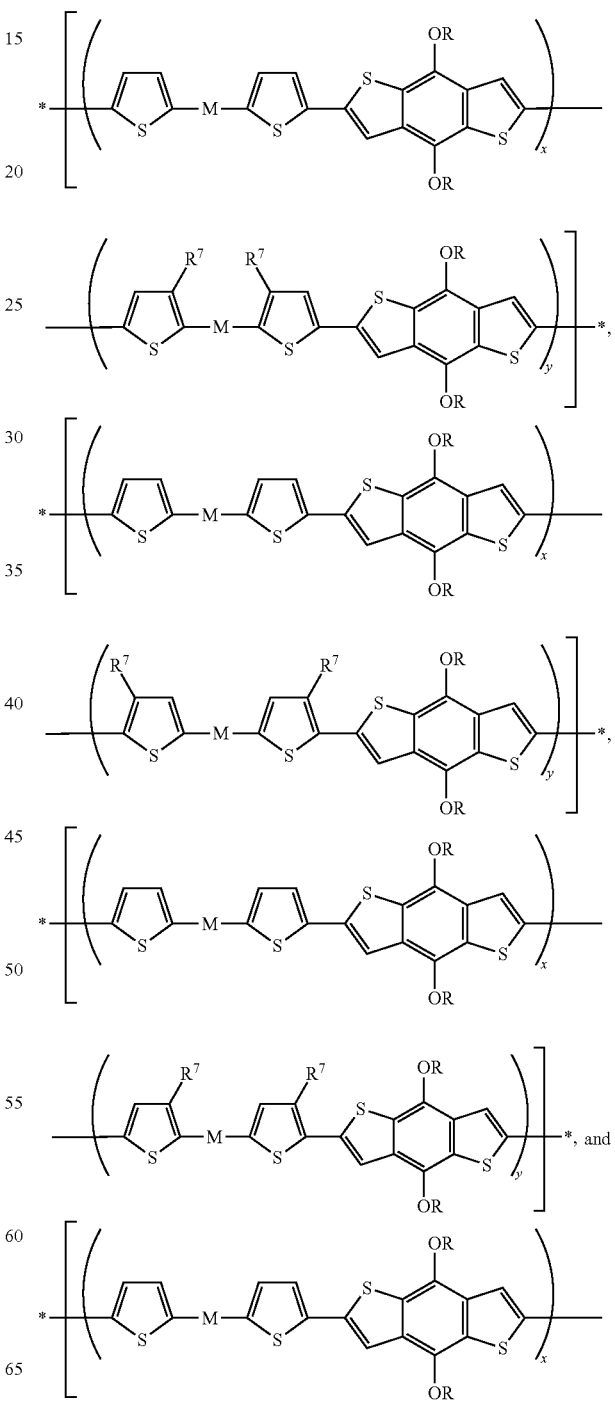

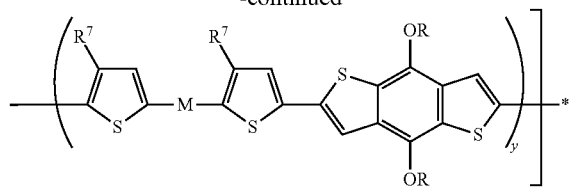

wherein M is an optionally substituted 2,1,3-benzothiadiazole-4,7-diyl group, R is a branched $C_{6-20}$ alkyl group, $R^7$ is a linear $C_{6-20}$ alkyl group or a linear $C_{6-20}$ alkox group, and x and y are real numbers representing mole fractions wherein $0.1 \leq x \leq 0.9$, $0.1 \leq y \leq 0.9$, and the sum of x and y is about 1.

2. The device of claim 1, wherein the copolymer has a formula selected from:

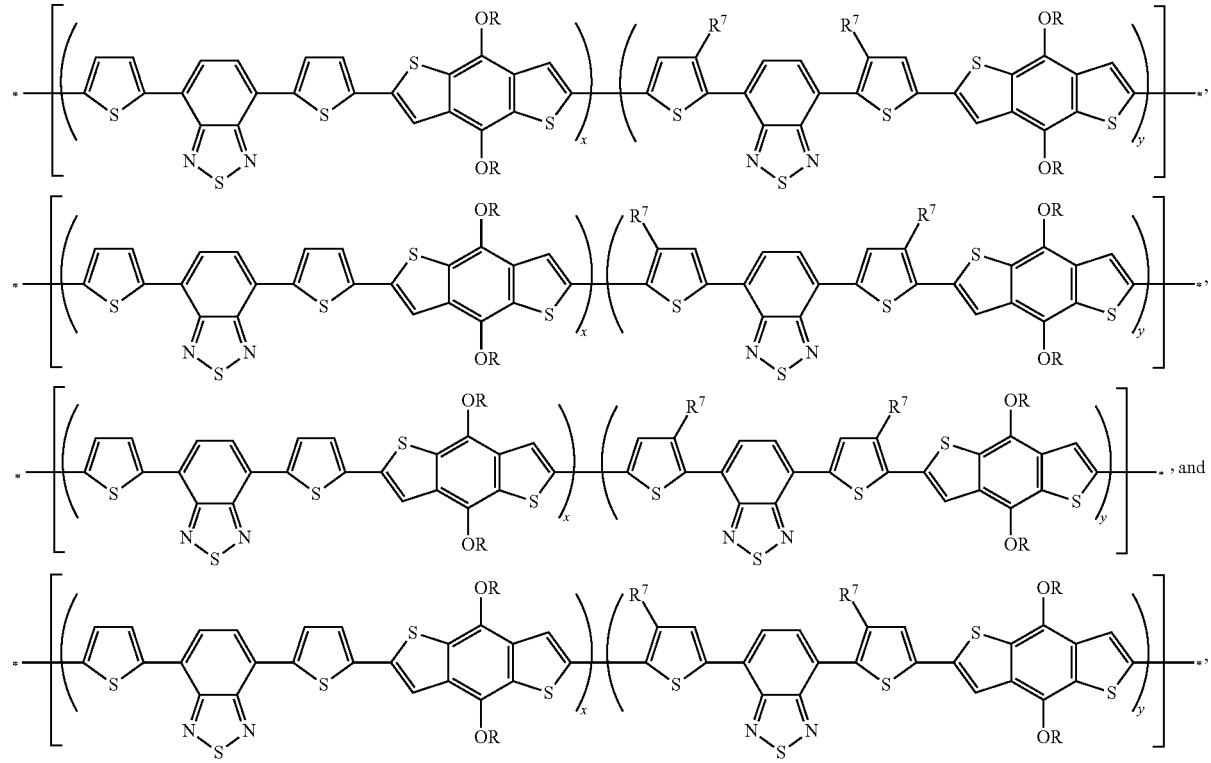

wherein R is a branched $C_{6-20}$ alkyl group, $R^7$ is a linear $C_{6-20}$ alkyl group, and x and y are real numbers representing mole fractions, wherein $0.2 \leq x \leq 0.8$, $0.2 \leq y \leq 0.8$, and the sum of x and y is about 1.

3. The device of claim 1, wherein the copolymer has a formula selected from:

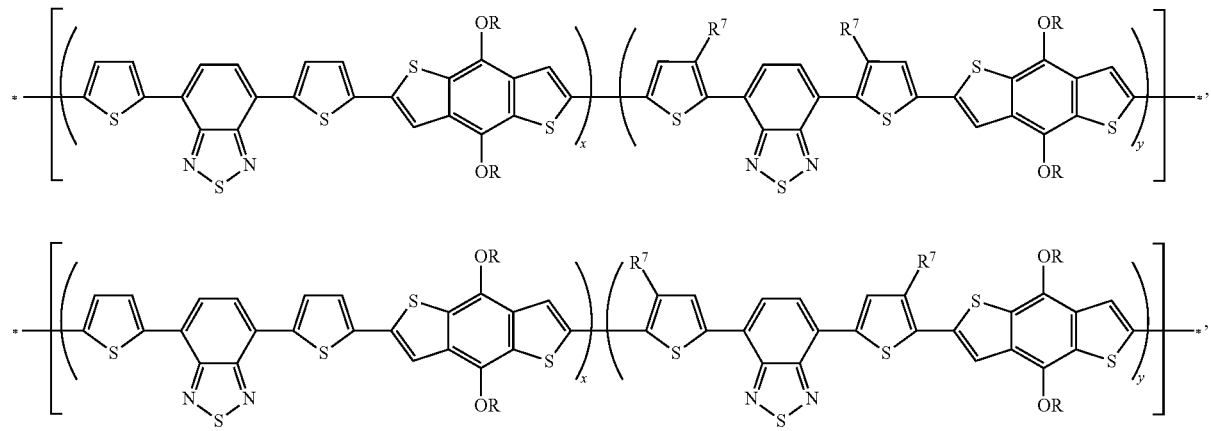

-continued

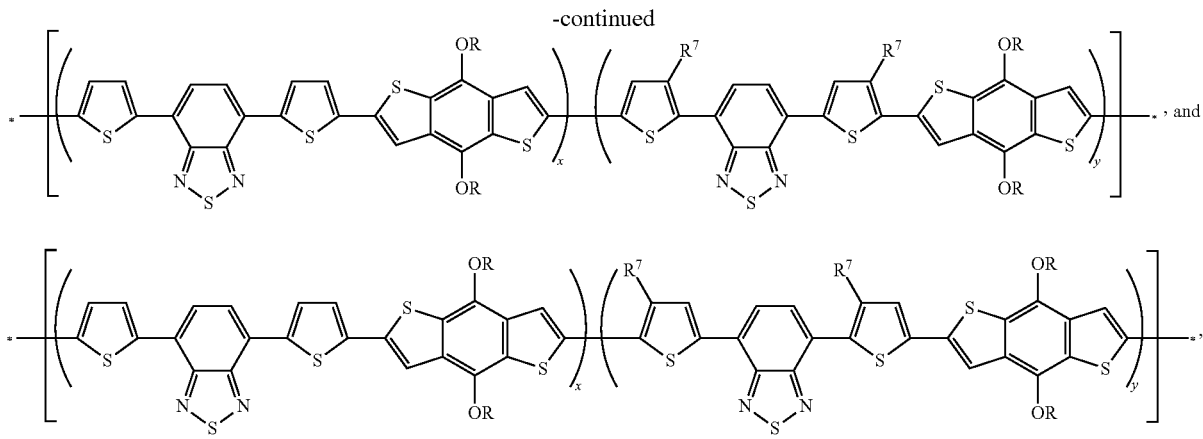

wherein R is a branched $C_{6-20}$ alkyl group, $R^7$ is a linear $C_{6-20}$ alkoxy group, and x and y are real numbers representing mole fractions, wherein $0.2 \leq x \leq 0.8$, $0.2 \leq y \leq 0.8$, and the sum of x and y is about 1.

4. The device of claim 1, wherein $0.5 \leq x \leq 0.9$ and $0.1 \leq y \leq 0.5$, and wherein the sum of x and y is about 1.

5. The device of claim 1, wherein the unit comprising x mole fraction of the copolymer and the unit comprising y mole fraction of the copolymer are repeated in a random manner.

6. The device of claim 1, wherein the copolymer has a degree of polymerization (n) in the range from 10 to about 10,000.

7. The device of claim 1 configured as an organic photovoltaic device comprising an anode, a cathode, and in between the anode and the cathode the semiconductor component according to claim 1.

8. The device of claim 7, wherein the organic photovoltaic device is a bulk heterojunction photovoltaic device.

9. The device of claim 8, wherein the semiconductor component is photoactive and comprises a blend material, wherein the copolymer in the blend material functions as an electron-donor and the blend material further comprises an electron-acceptor compound.

10. The device of claim 9, wherein the electron-acceptor compound is a fullerene compound.

11. The device of claim 10, wherein the fullerene compound is [6,6]-phenyl-$C_{61}$-butyric acid methyl ester (PCBM).

12. The device of claim 7, wherein the power conversion efficiency is at least about 4%.

13. The device of claim 1 configured as an organic light emitting diode comprising a substrate, an anode, a cathode, and in between the anode and the cathode the semiconductor component according to claim 1.

14. The device of claim 1 configured as an organic transistor further comprising a third electrode and a dielectric component, wherein the semiconductor component is in contact with the first electrode and the third electrode, and the dielectric component is in contact with the semiconductor component on one side and the second electrode on an opposite side.

15. The device of claim 14, wherein the organic transistor is an organic thin film transistor.

16. The device of claim 14, wherein the organic transistor is an organic light emitting transistor.

17. The device of claim 1, wherein M is

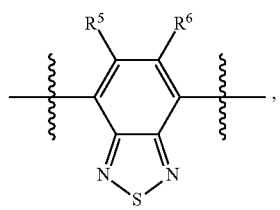

wherein $R^5$ and $R^6$ independently are H or -L-R, wherein L, at each occurrence, independently is selected from the group consisting of O, S, and a covalent bond; and R, at each occurrence, independently is a $C_{1-40}$ alkyl group.

18. An electronic, optical or optoelectronic device comprising:
a first electrode,
a second electrode, and
a semiconductor component disposed between the first electrode and the second electrode, the semiconductor component comprising a copolymer having a formula selected from:

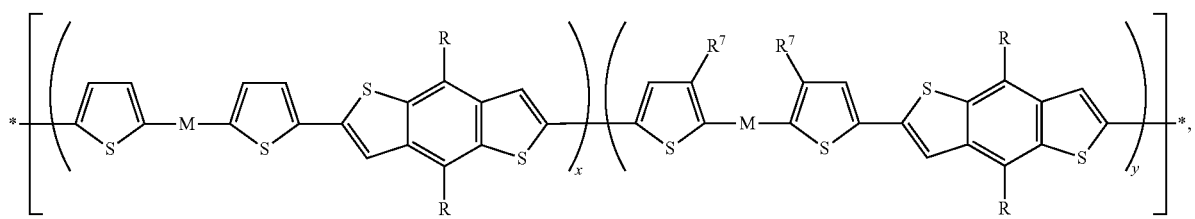

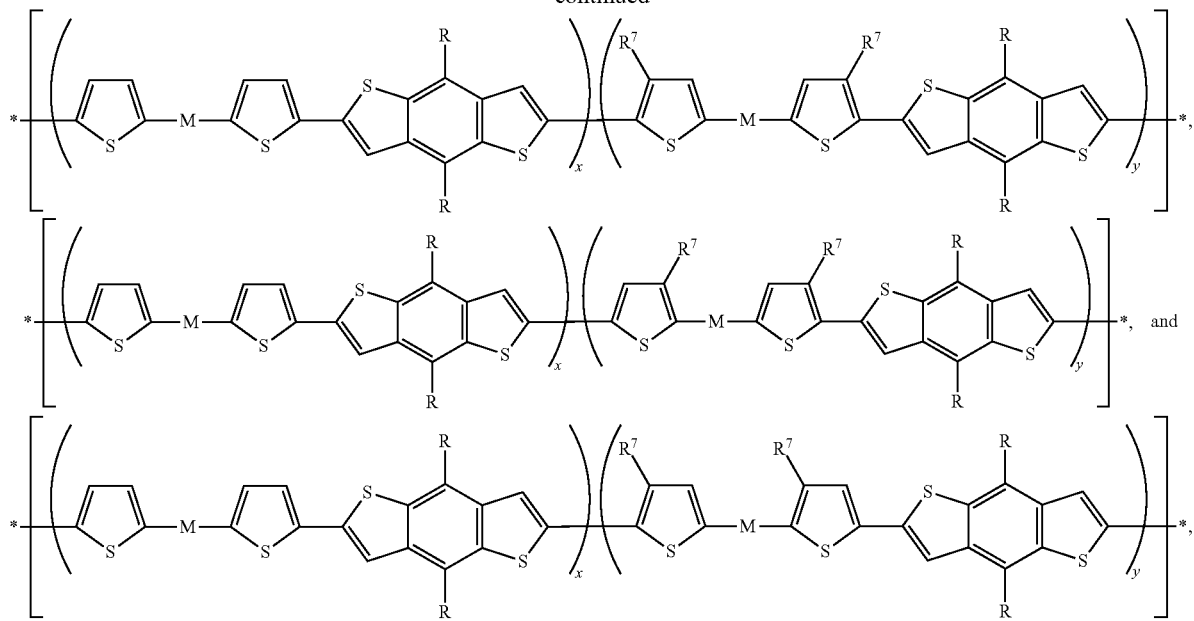
wherein M is an optionally substituted 2,1,3-benzothiadiazole-4,7-diyl group, R is a branched $C_{6-20}$ alkyl group, $R^7$ is a linear $C_{6-20}$ alkyl group or a linear $C_{6-20}$ alkoxy group, and x and y are real numbers representing mole fractions wherein $0.1 \leq x \leq 0.9$, $0.2 \leq y \leq 0.9$ and the sum of x and y is about 1.
19. The device of claim 18, wherein the copolymer has a formula selected from:
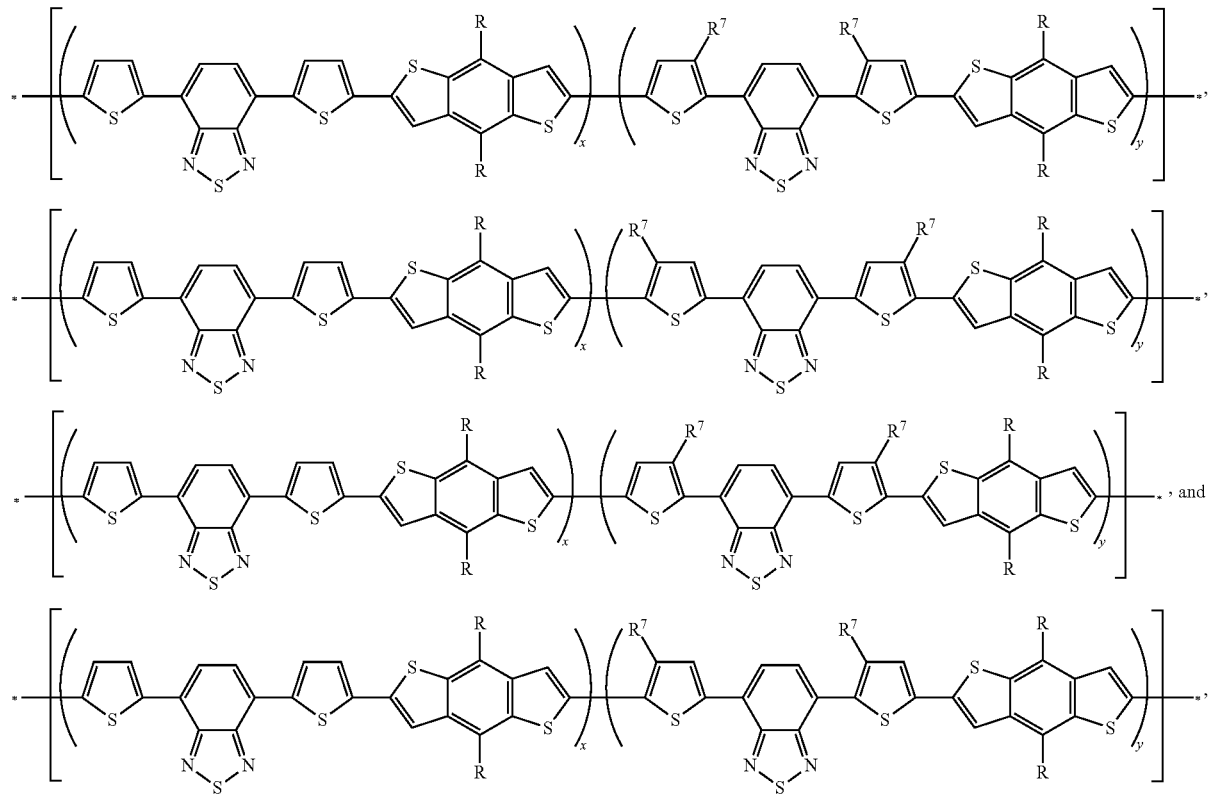

wherein R is a branched $C_{6-20}$ alkyl group, R' is a linear $C_{6-20}$ alkyl group, and x and y are real numbers representing mole fractions, wherein $0.2 \leq x \leq 0.8$, $0.2 \leq y \leq 0.8$, and the sum of x and y is about 1.

20. The device of claim 18, wherein the copolymer has a formula selected from:

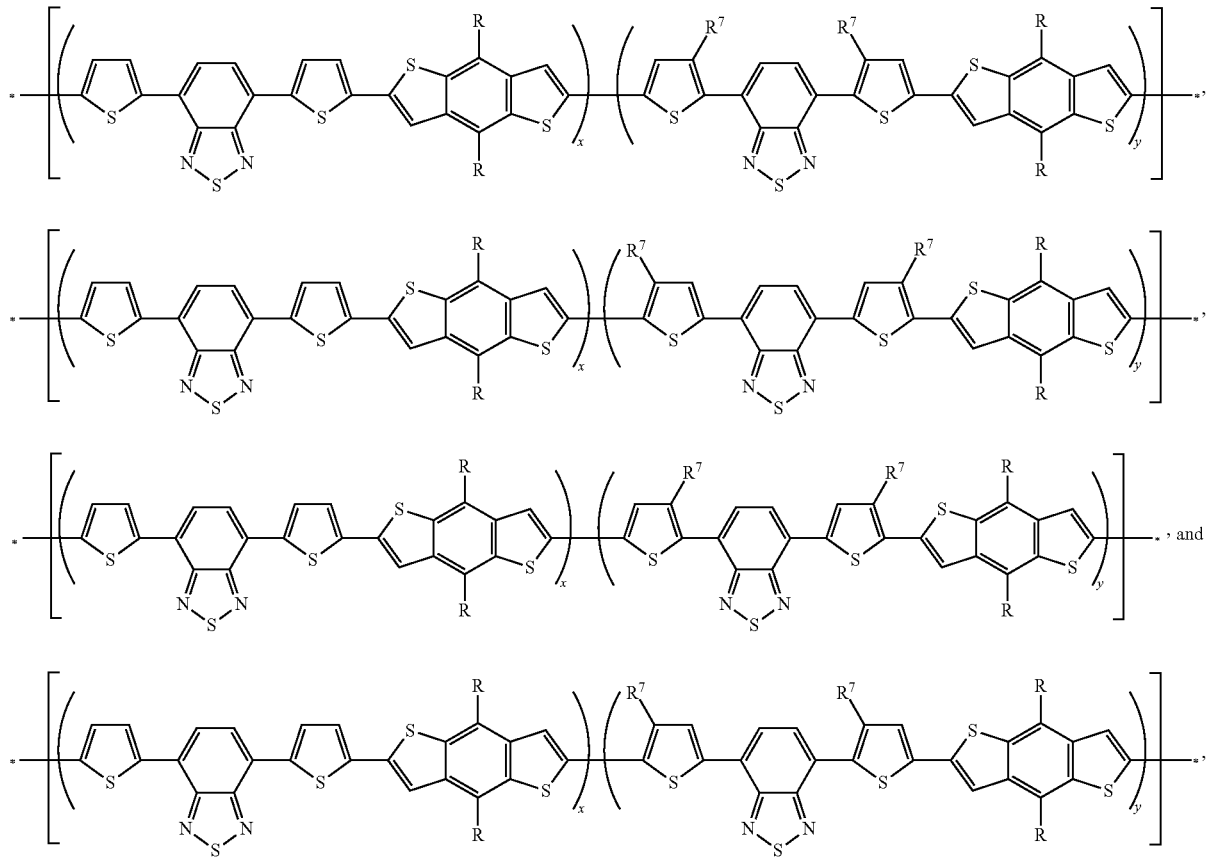

wherein R is a branched $C_{6-20}$ alkyl group, $R^7$ is a linear $C_{6-20}$ alkoxy group, and x and y are real numbers representing mole fractions, wherein $0.2 \leq x \leq 0.8$, $0.2 \leq y \leq 0.8$, and the sum of x and y is about 1.

21. The device of claim 18, wherein M is

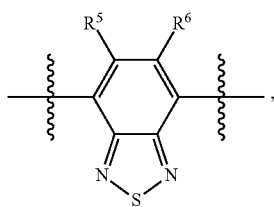

wherein $R^5$ and $R^6$ independently are H or -L-R, wherein L, at each occurrence, independently is selected from the group consisting of O, S, and a covalent bond; and R, at each occurrence, independently is a $C_{1-40}$ alkyl group.

22. The device of claim 18, wherein $0.5 \leq x \leq 0.9$ and $0.1 \leq y \leq 0.5$, and wherein the sum of x and y is about 1.

23. The device of claim 18, wherein the unit comprising x mole fraction of the copolymer and the unit comprising y mole fraction of the copolymer are repeated in a random manner.

24. The device of claim 18, wherein the copolymer has a degree of polymerization (n) in the range from 10 to about 10,000.

25. The device of claim 18 configured as an organic photovoltaic device comprising an anode, a cathode, and in between the anode and the cathode the semiconductor component according to claim 18.

26. The device of claim 25, wherein the organic photovoltaic device is a bulk heterojunction photovoltaic device.

27. The device of claim 18 configured as an organic light emitting diode comprising a substrate, an anode, a cathode, and in between the anode and the cathode the semiconductor component according to claim 18.

28. The device of claim 18 configured as an organic transistor further comprising a third electrode and a dielectric component, wherein the semiconductor component is in contact with the first electrode and the third electrode, and the dielectric component is in contact with the semiconductor component on one side and the second electrode on an opposite side.

29. The device of claim 18, wherein the organic transistor is an organic thin film transistor.

30. The device of claim 28, wherein the organic transistor is an organic light emitting transistor.

* * * * *